(12) United States Patent
Lichtenwalner et al.

(10) Patent No.: US 12,094,926 B2
(45) Date of Patent: Sep. 17, 2024

(54) SIDEWALL DOPANT SHIELDING METHODS AND APPROACHES FOR TRENCHED SEMICONDUCTOR DEVICE STRUCTURES

(71) Applicant: Cree, Inc., Durham, NC (US)

(72) Inventors: Daniel J. Lichtenwalner, Raleigh, NC (US); Naeem Islam, Morrisville, NC (US); Woongsun Kim, Cary, NC (US); Sei-Hyung Ryu, Cary, NC (US)

(73) Assignee: Wolfspeed, Inc., Durham, NC (US)

( * ) Notice: Subject to any disclaimer, the term of this patent is extended or adjusted under 35 U.S.C. 154(b) by 172 days.

(21) Appl. No.: 16/993,680

(22) Filed: Aug. 14, 2020

(65) Prior Publication Data

US 2022/0052152 A1 Feb. 17, 2022

(51) Int. Cl.
*H01L 21/26* (2006.01)
*H01L 21/04* (2006.01)
(Continued)

(52) U.S. Cl.
CPC ........ *H01L 29/063* (2013.01); *H01L 21/0465* (2013.01); *H01L 21/047* (2013.01);
(Continued)

(58) Field of Classification Search
CPC ............. H01L 21/0415; H01L 21/2253; H01L 21/046; H01L 21/0465; H01L 21/26513;
(Continued)

(56) References Cited

U.S. PATENT DOCUMENTS 4,587,712 A * 5/1986 Baliga ................... H01L 21/743
438/137
5,208,181 A * 5/1993 Chi ........................ H01L 21/266
438/944
(Continued)

FOREIGN PATENT DOCUMENTS

JP 2005333068 A 12/2005
JP 2007242852 A 9/2007
(Continued)

OTHER PUBLICATIONS

"Fundamentals of Power Semiconductor Devices, Second Edition" by B. Jayant Baliga, pp. 496-506 section 6.22.4 "Shielded Trench-Gate Power MOSFET Structure" (Year: 2019).*
(Continued)

*Primary Examiner* — Eric A. Ward
(74) *Attorney, Agent, or Firm* — Myers Bigel, P.A.

(57) ABSTRACT

Semiconductor devices and methods of forming a semiconductor device that includes a deep shielding pattern that may improve a reliability and/or a functioning of the device. An example method may include forming a wide band-gap semiconductor layer structure on a substrate, the semiconductor layer structure including a drift region that has a first conductivity type; forming a plurality of gate trenches in an upper portion of the semiconductor layer structure, the gate trenches spaced apart from each other, each gate trench having a bottom surface, a first sidewall, a second sidewall, and an upper opening; forming an obstruction over a portion of each gate trench that partially obscures the upper opening;
(Continued)

and implanting dopants having a second conductivity type that is opposite the first conductivity type into the bottom surfaces of the gate trenches, where the dopants implanted into the bottom surface of the gate trenches form deep shielding patterns.

19 Claims, 22 Drawing Sheets

(51) Int. Cl.
    *H01L 29/06*     (2006.01)
    *H01L 29/10*     (2006.01)
    *H01L 29/16*     (2006.01)
    *H01L 29/66*     (2006.01)
    *H01L 29/78*     (2006.01)

(52) U.S. Cl.
    CPC ........ *H01L 21/0475* (2013.01); *H01L 21/049* (2013.01); *H01L 29/1095* (2013.01); *H01L 29/1608* (2013.01); *H01L 29/66068* (2013.01); *H01L 29/7813* (2013.01)

(58) Field of Classification Search
    CPC ............. H01L 21/266; H01L 21/26586; H01L 29/7813; H01L 29/1095; H01L 29/41766; H01L 29/66734; H01L 29/66727; H01L 29/1608; H01L 29/0878; H01L 29/66068; H01L 29/0623; H01L 29/42368; H01L 29/0634; H01L 29/7802; H01L 29/66719; H01L 29/4236; H01L 29/407; H01L 29/7397; H01L 29/0847; H01L 29/66348; H01L 29/7827; H01L 29/086; H01L 29/0653; H01L 29/7825
    See application file for complete search history.

(56) References Cited

U.S. PATENT DOCUMENTS

| | | | |
|---|---|---|---|
| 6,930,352 B2 | 8/2005 | Saito et al. | |
| 6,967,136 B2* | 11/2005 | Akatsu | H10B 12/0387 438/386 |
| 7,989,882 B2 | 8/2011 | Zhang et al. | |
| 7,999,312 B2 | 8/2011 | Takaya et al. | |
| 8,232,558 B2 | 7/2012 | Zhang et al. | |
| 9,012,984 B2 | 4/2015 | Cheng et al. | |
| 9,136,372 B2 | 9/2015 | Miyahara et al. | |
| 9,293,558 B2 | 3/2016 | Siemieniec et al. | |
| 9,887,287 B1 | 2/2018 | Lichtenwalner et al. | |
| 2004/0195618 A1 | 10/2004 | Saito et al. | |
| 2009/0166730 A1* | 7/2009 | Okuno | H01L 29/0623 257/330 |
| 2010/0224932 A1* | 9/2010 | Takaya | H01L 29/66734 257/E21.334 |
| 2012/0049202 A1* | 3/2012 | Nakano | H01L 29/42368 257/77 |
| 2013/0001592 A1 | 1/2013 | Miyahara et al. | |
| 2013/0306983 A1* | 11/2013 | Nakano | H01L 29/7813 438/270 |
| 2014/0145206 A1 | 5/2014 | Siemieniec et al. | |
| 2014/0361349 A1 | 12/2014 | Alexandrov et al. | |
| 2015/0357415 A1 | 12/2015 | Kagawa et al. | |
| 2016/0005837 A1 | 1/2016 | Cheng et al. | |
| 2016/0079412 A1* | 3/2016 | Tomita | H01L 29/41741 438/270 |
| 2017/0040425 A1 | 2/2017 | Kueck et al. | |
| 2017/0317162 A1* | 11/2017 | Nishimura | H01L 29/66348 |
| 2018/0204906 A1* | 7/2018 | Okada | H01L 29/1608 |
| 2018/0308975 A1* | 10/2018 | Ohse | H01L 29/1608 |
| 2019/0198633 A1* | 6/2019 | Chien | H01L 21/28211 |
| 2020/0044077 A1* | 2/2020 | Saggio | H01L 29/4236 |
| 2021/0083101 A1* | 3/2021 | Kyogoku | H01L 29/0878 |

FOREIGN PATENT DOCUMENTS

| | | |
|---|---|---|
| JP | 2014107571 A | 6/2014 |
| WO | 2015156024 A1 | 10/2015 |

OTHER PUBLICATIONS

"Notification of Transmittal of the International Search Report and the Written Opinion of the International Searching Authority, or the Declaration, corresponding to Application No. PCT/US2017/054212, mailing date: Nov. 28, 2017, 13 pgs".

Hiyoshi, Toru , et al., "SiC High Channel Mobility MOSFET", SEI Technical Review, No. 77, Oct. 2013, 122-126.

Kagawa, Yasuhiro , et al., "Introduction of Depletion Stopper for Reduction of JFET Resistance for 4H-SiC Trench MOSFET", Materials Science Forum, vols. 821-823, Feb. 2, 2015, 761-764.

* cited by examiner

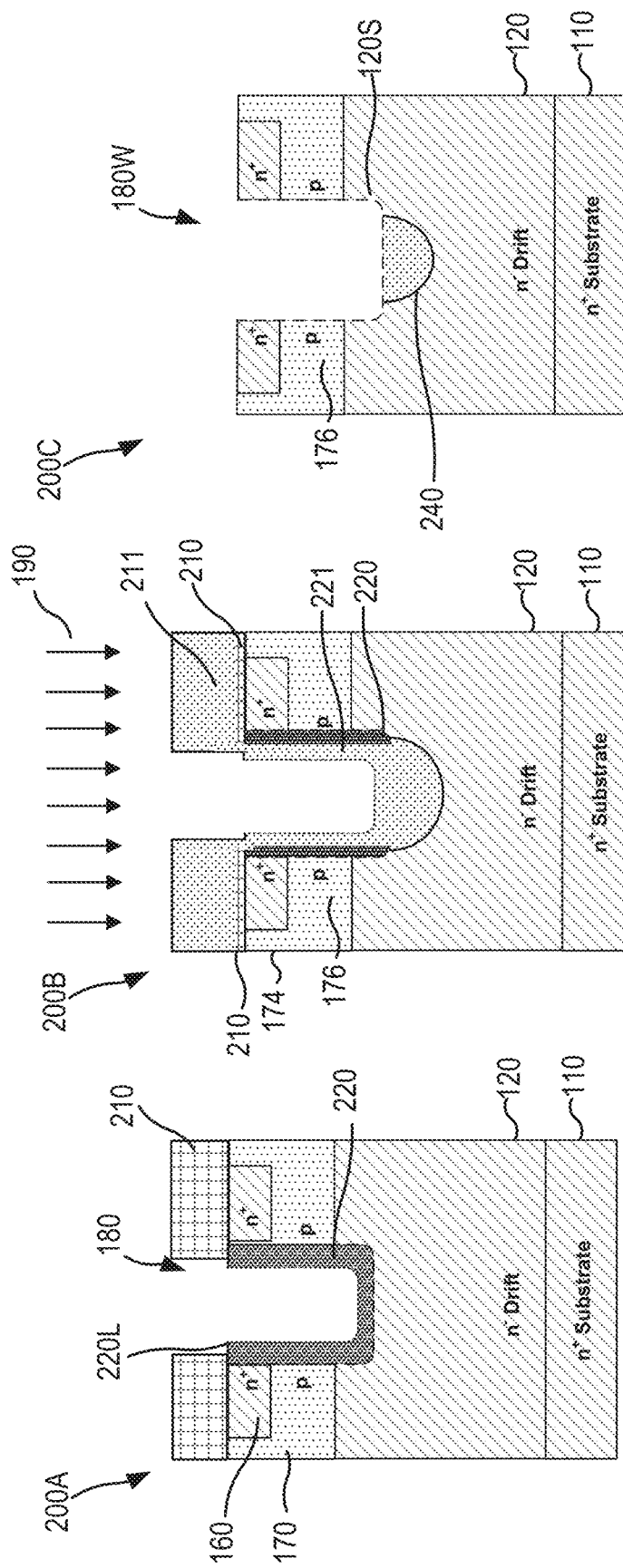

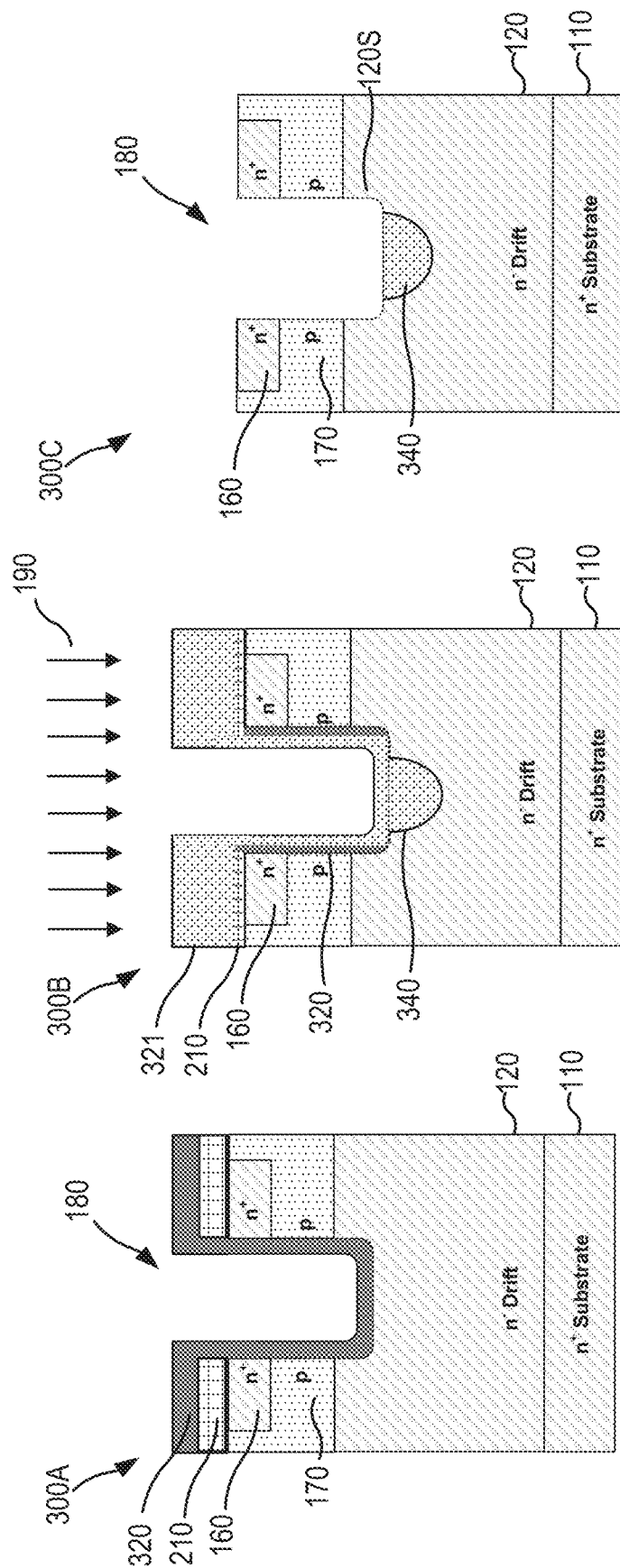

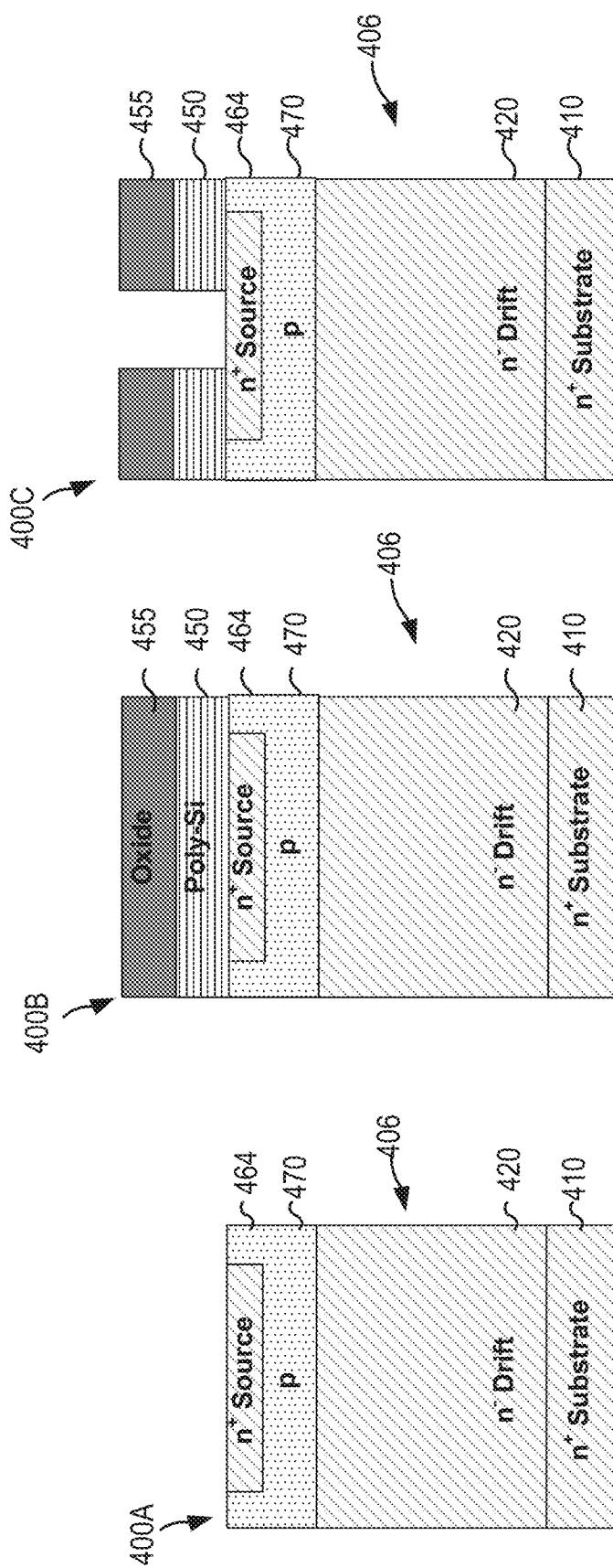

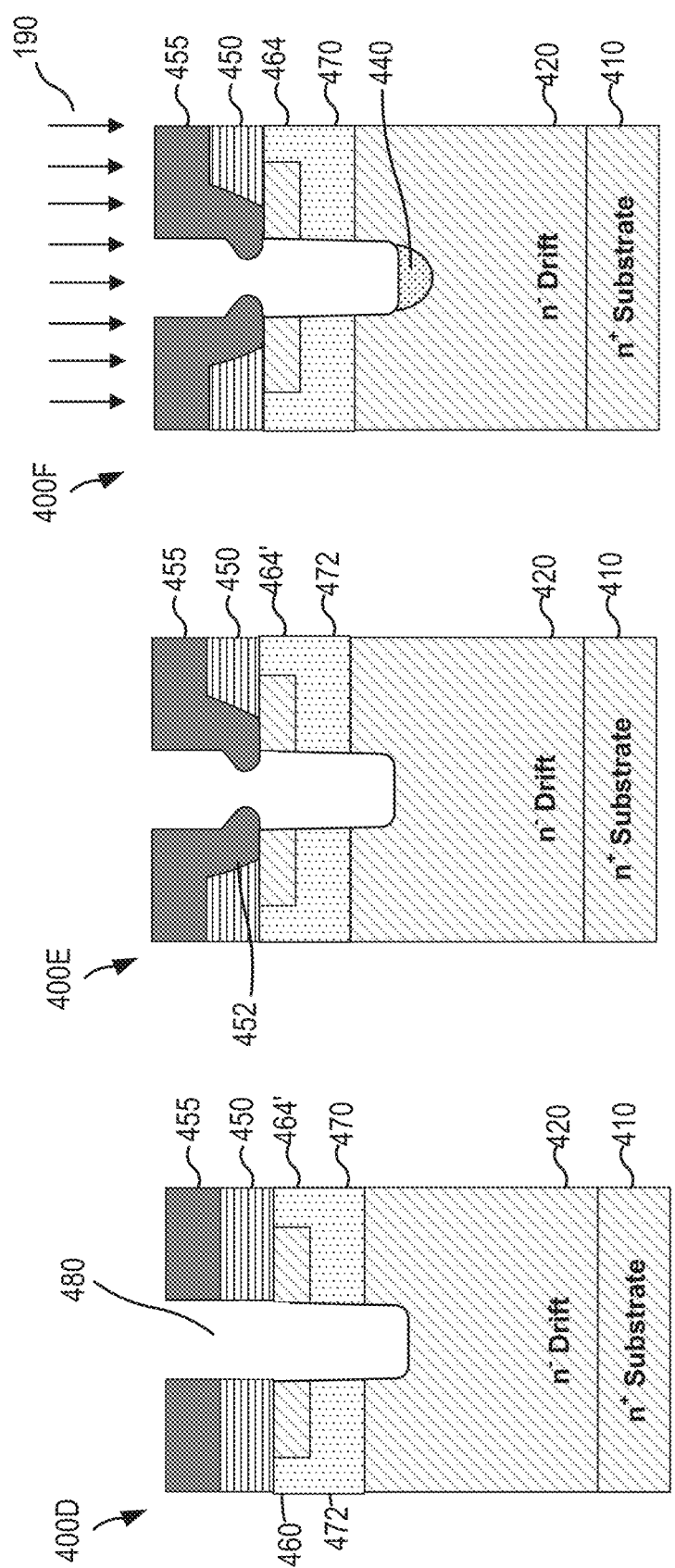

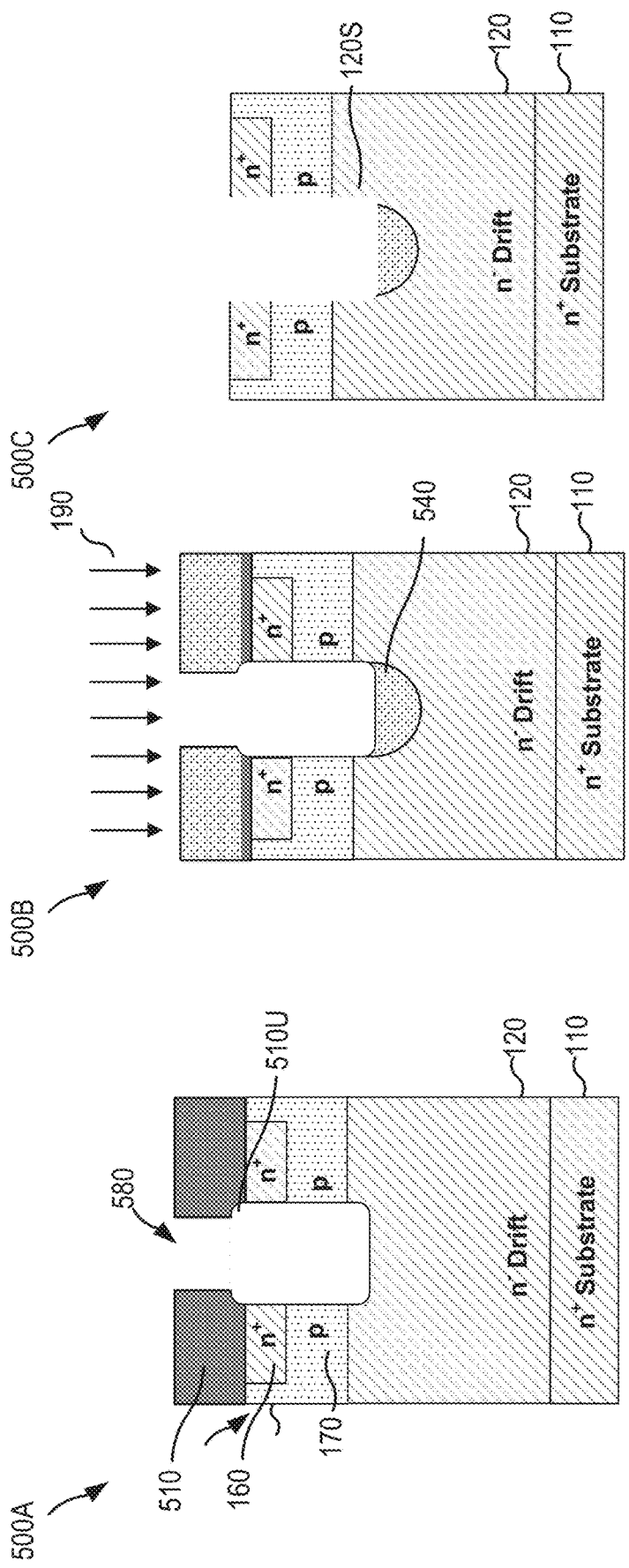

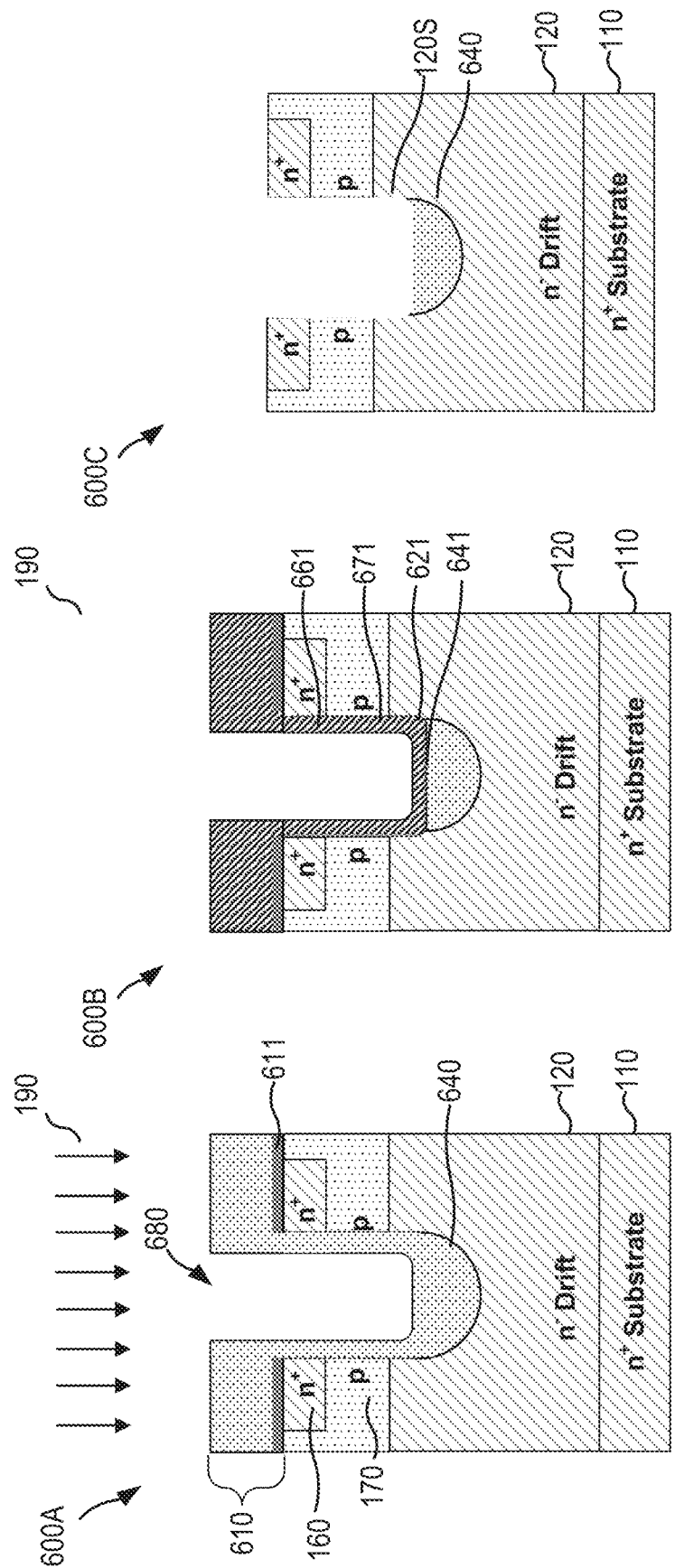

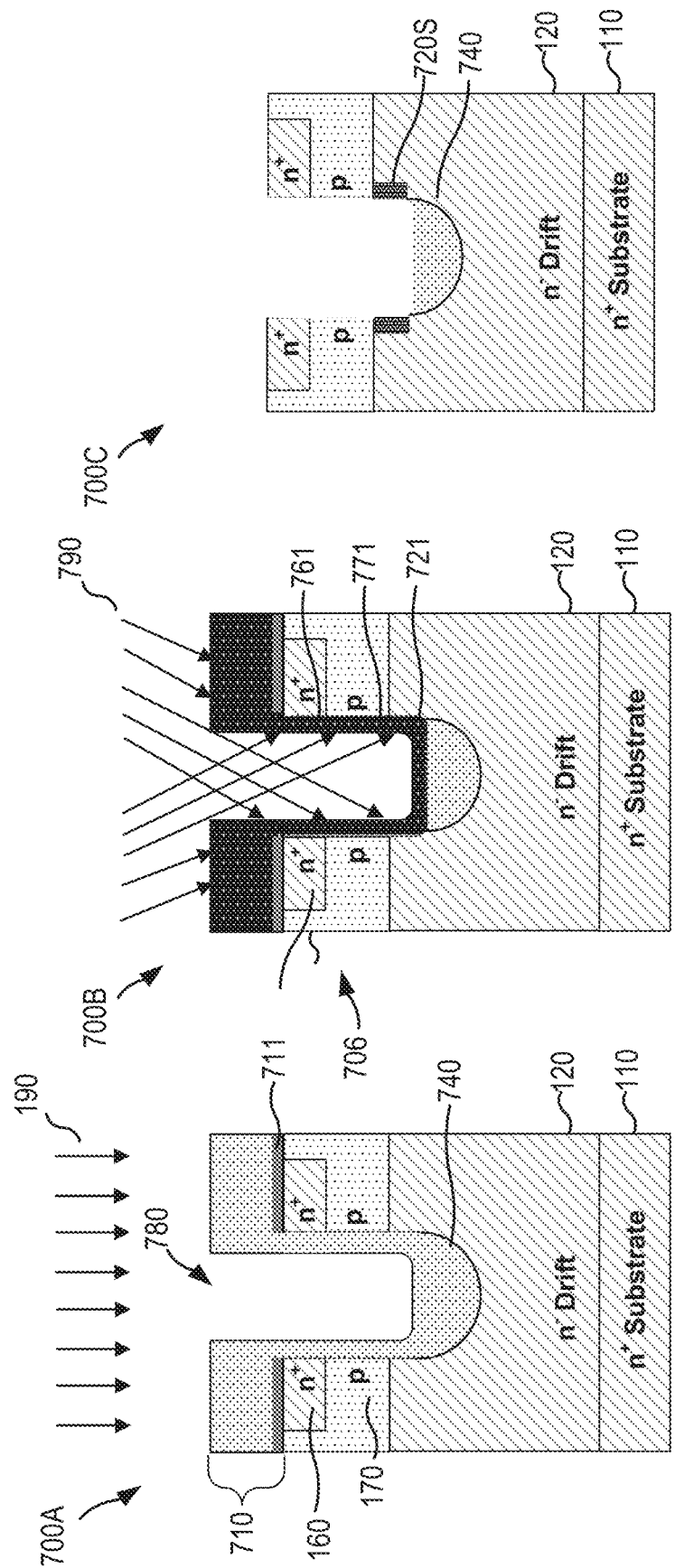

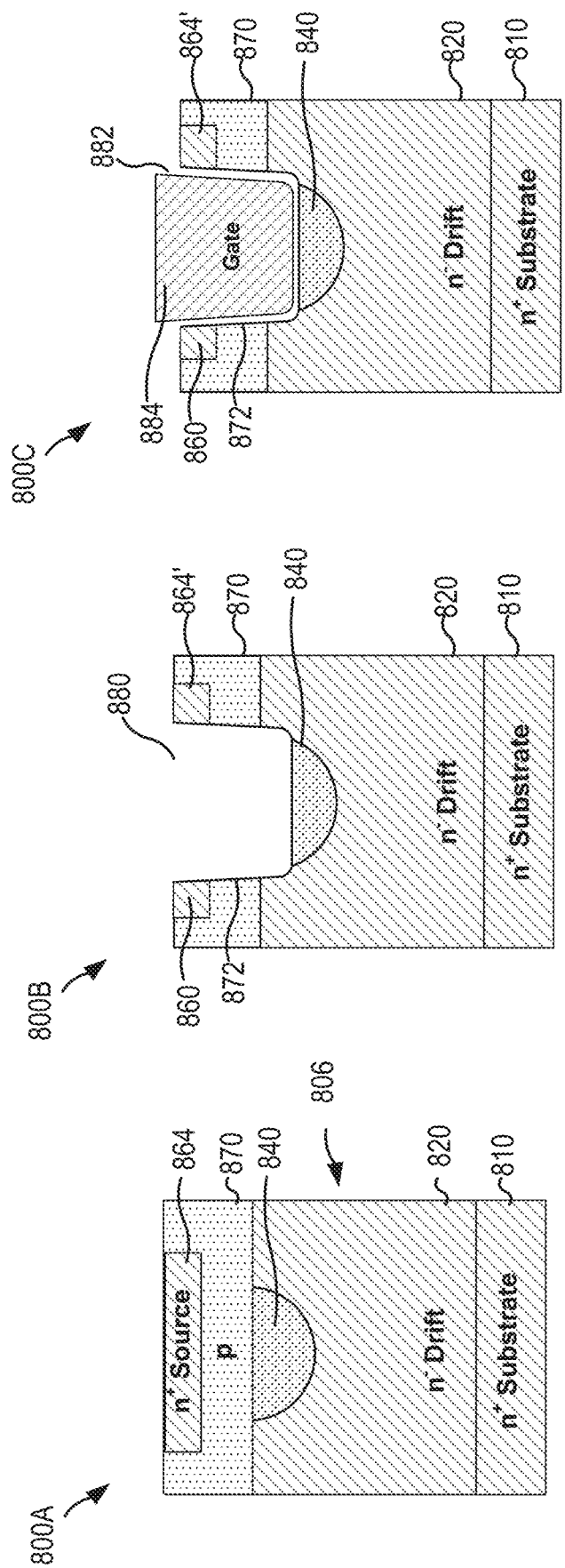

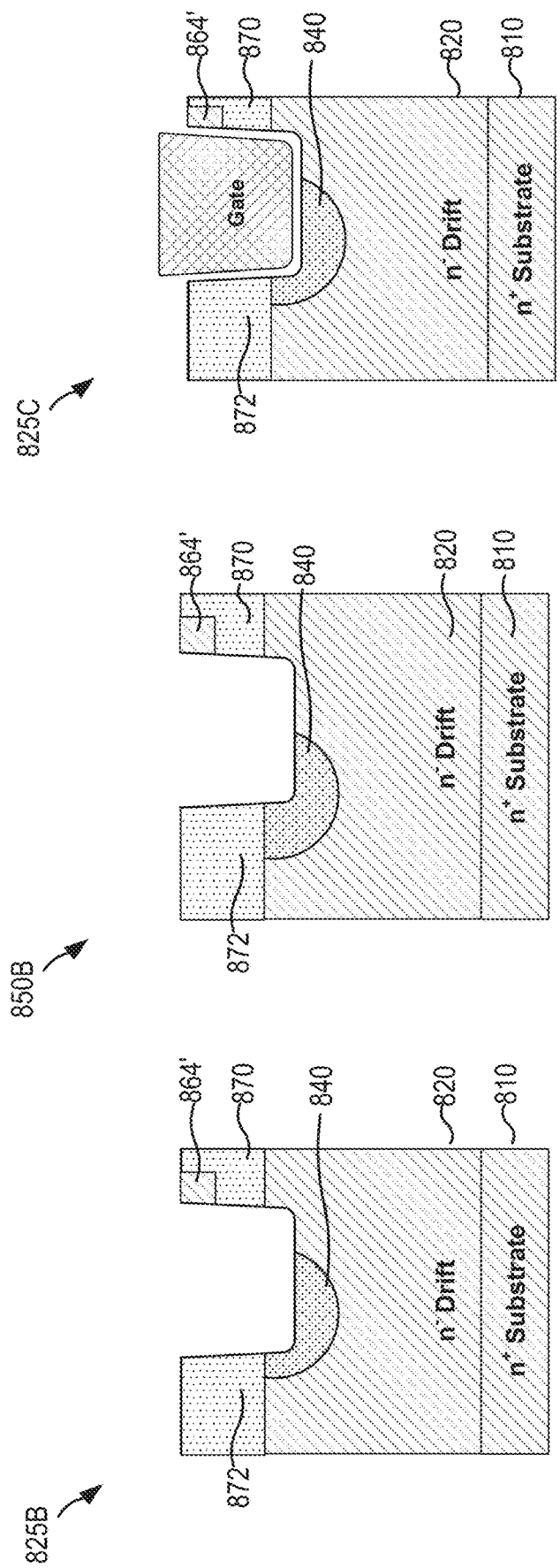

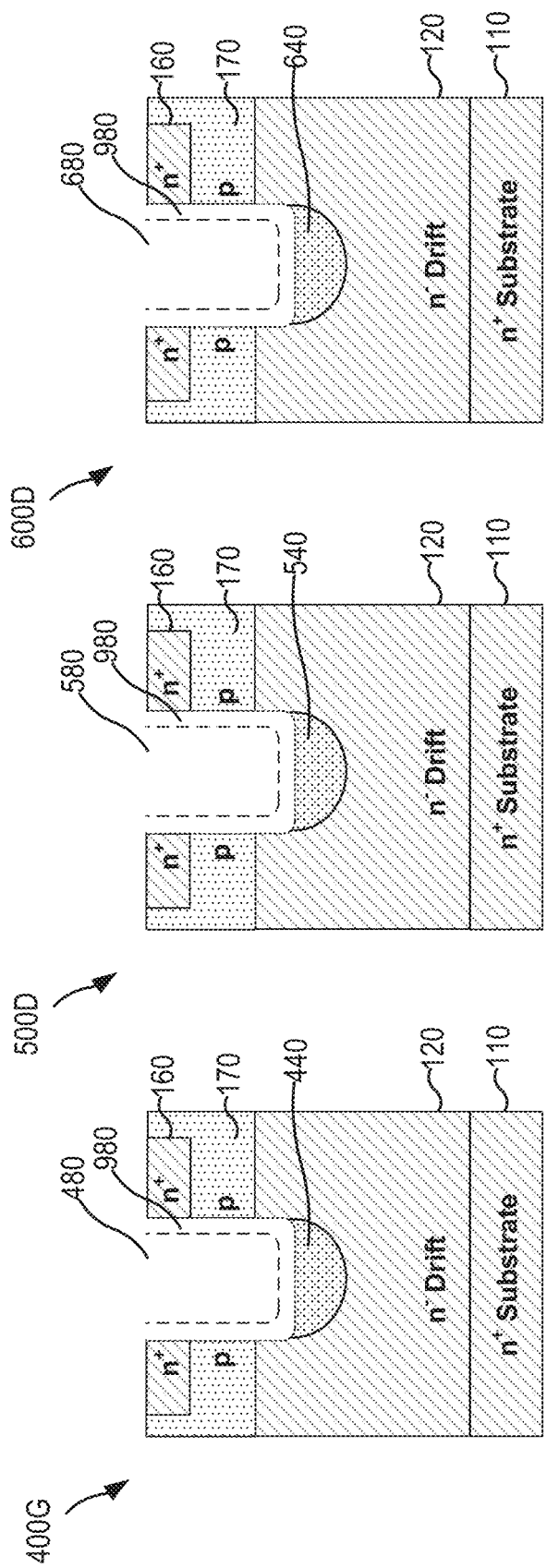

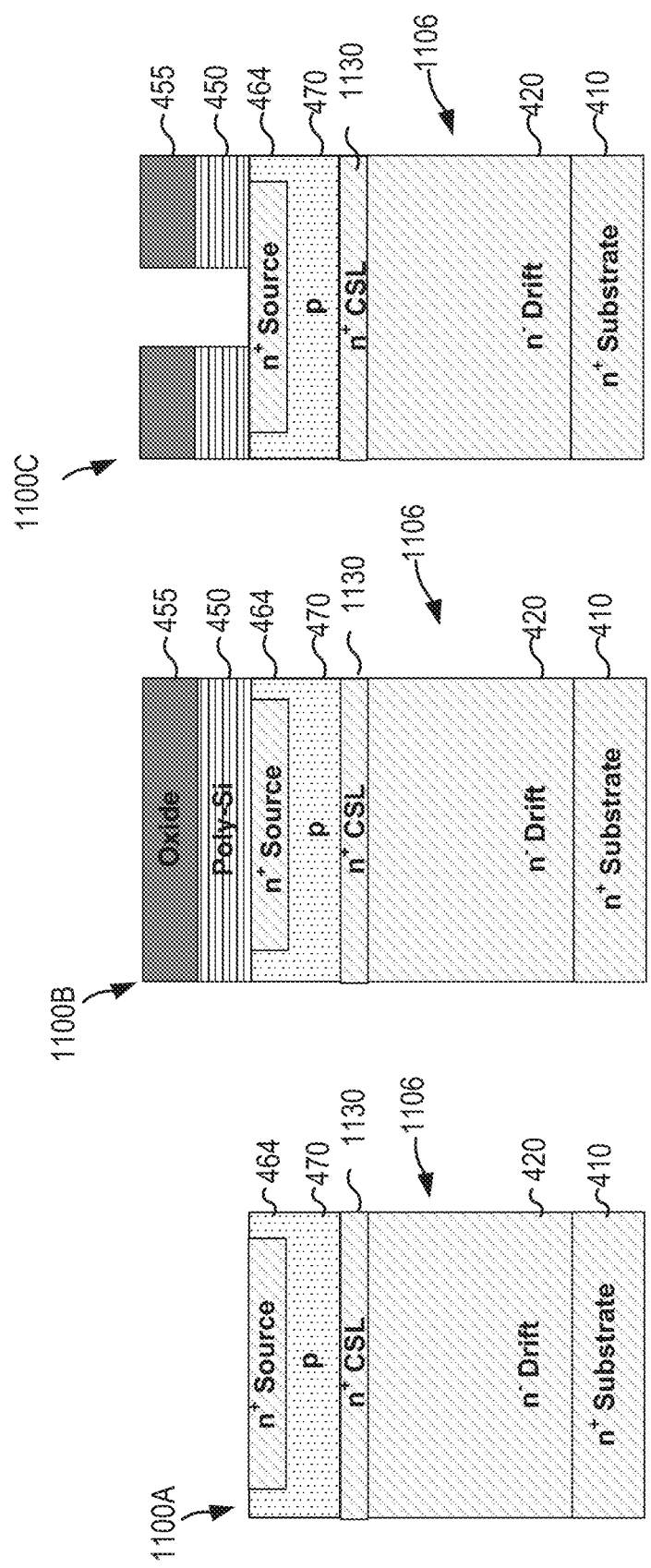

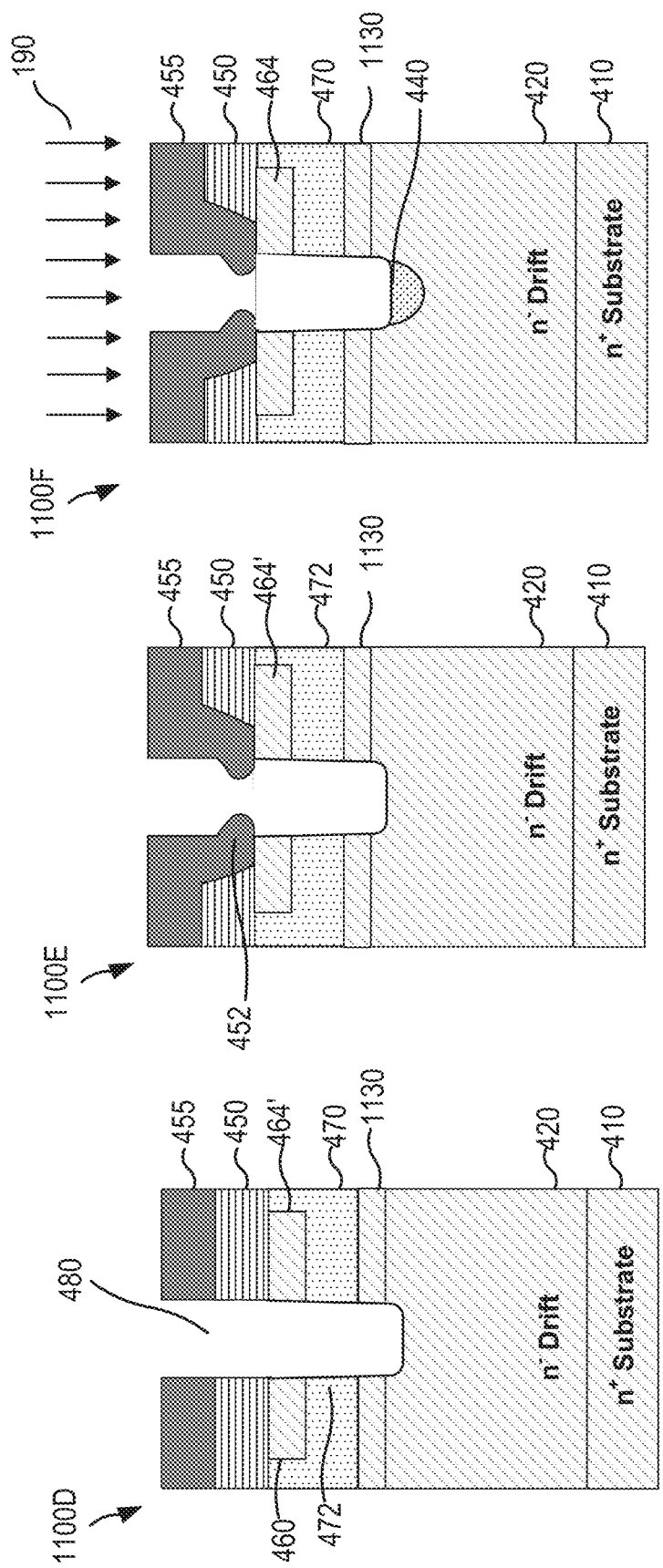

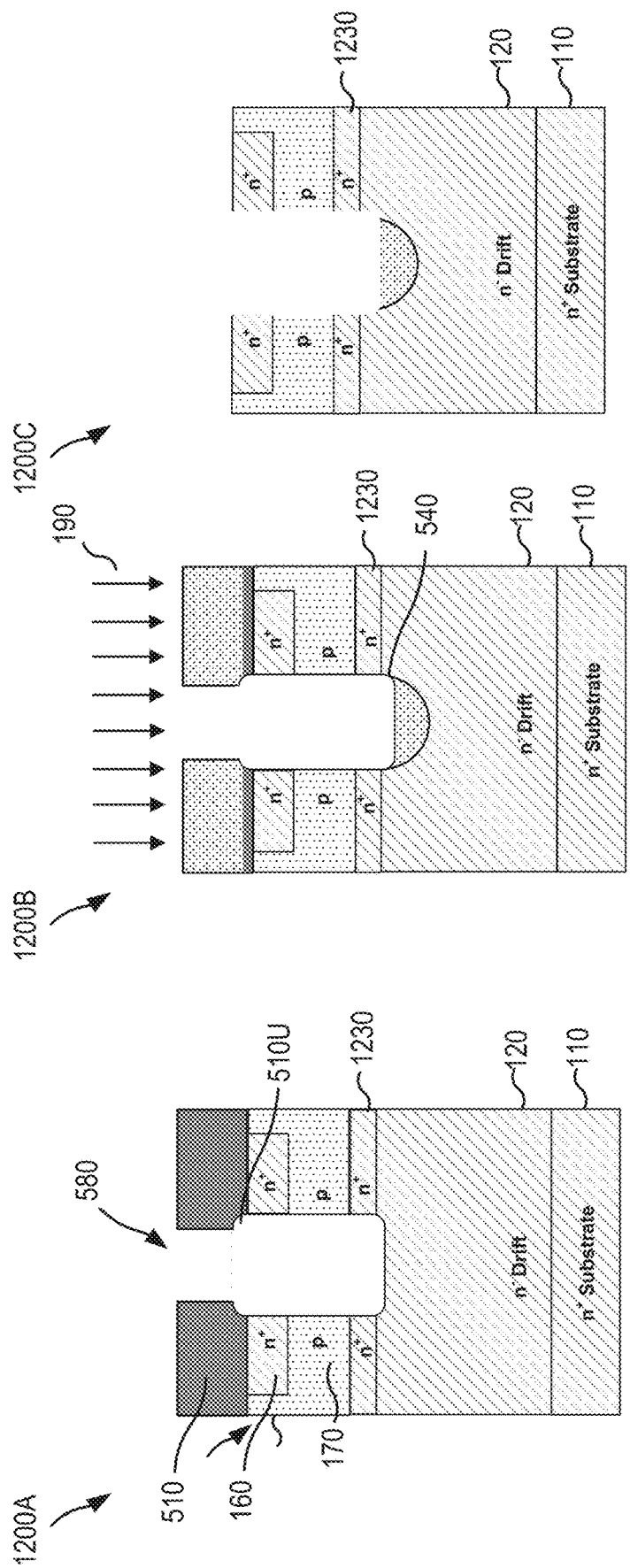

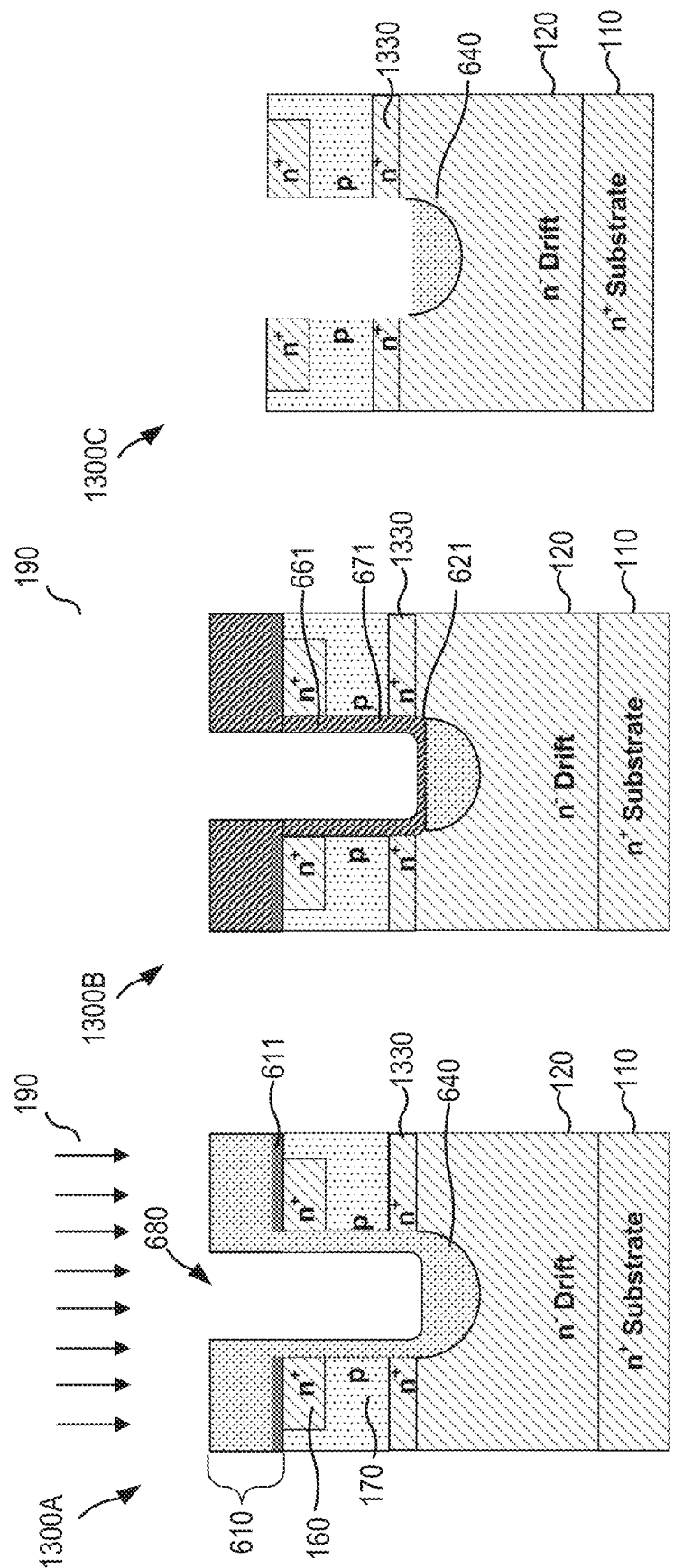

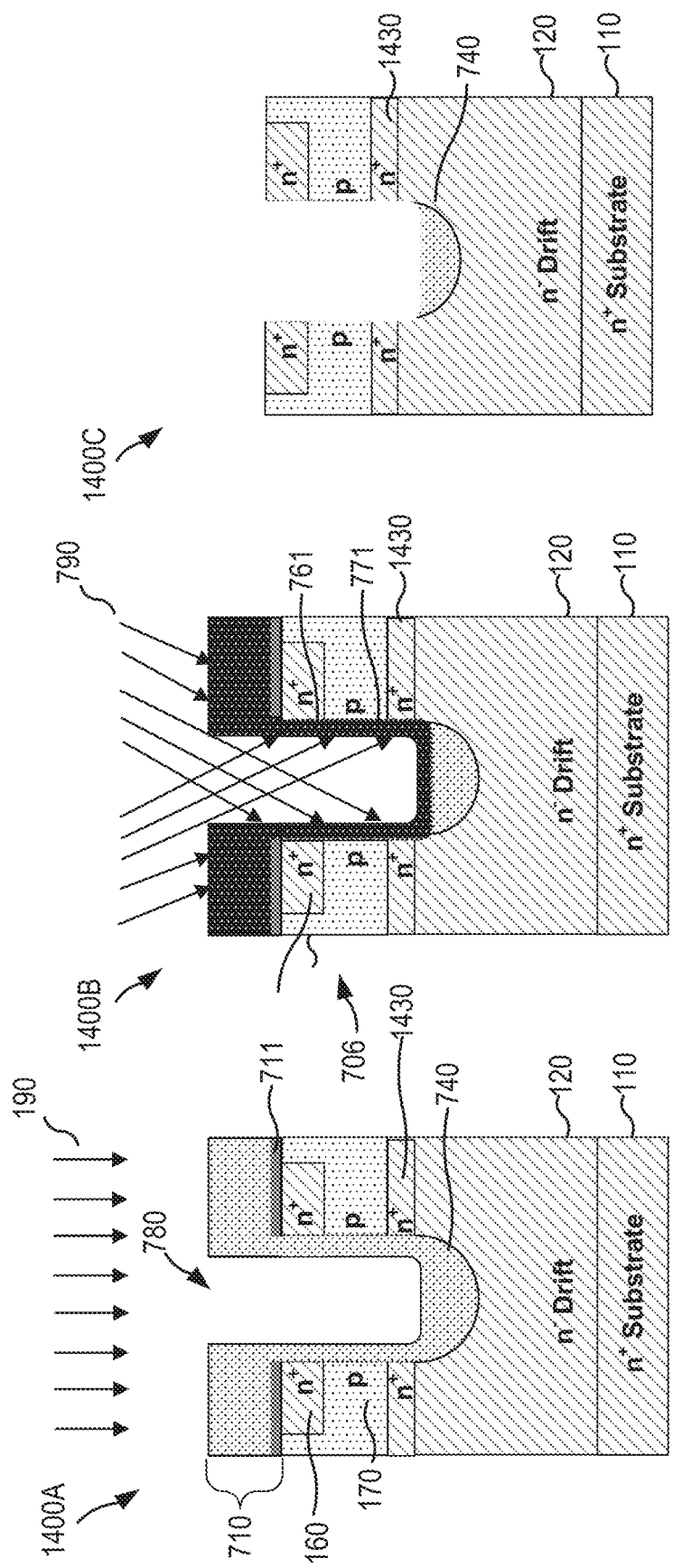

SIDEWALL DOPANT SHIELDING METHODS AND APPROACHES FOR TRENCHED SEMICONDUCTOR DEVICE STRUCTURES

FIELD OF THE INVENTION

The present invention relates to power semiconductor devices and, more particularly, to power semiconductor devices having gate trenches and to methods of fabricating such devices.

BACKGROUND

Power semiconductor devices are used to carry large currents and support high voltages. A wide variety of power semiconductor devices are known in the art including, for example, power Metal Oxide Semiconductor Field Effect Transistors ("MOSFET"), bipolar junction transistors ("BJTs"), Insulated Gate Bipolar Transistors ("IGBT"), Junction Barrier Schottky diodes, Gate Turn-Off Transistors ("GTO"), MOS-controlled thyristors and various other devices. These power semiconductor devices are generally fabricated from wide band-gap semiconductor materials, such as silicon carbide ("SiC") or gallium nitride ("GaN") based semiconductor materials. Herein, a wide band-gap semiconductor material refers to a semiconductor material having a band-gap greater than 1.40 eV.

Power semiconductor devices can have a lateral structure or a vertical structure. In a device having a lateral structure, the terminals of the device (e.g., the drain, gate and source terminals for a power MOSFET device) are on the same major surface (i.e., top or bottom) of a semiconductor layer structure. In contrast, in a device having a vertical structure, at least one terminal is provided on each major surface of the semiconductor layer structure (e.g., in a vertical MOSFET device, the source may be on the top surface of the semiconductor layer structure and the drain may be on the bottom surface of the semiconductor layer structure). The semiconductor layer structure may or may not include an underlying substrate. Herein, the term "semiconductor layer structure" refers to a structure that includes one or more semiconductor layers, such as semiconductor substrates and/or semiconductor epitaxial layers.

A conventional power semiconductor device typically has a semiconductor substrate, such as a silicon carbide substrate having a first conductivity type (e.g., an n-type substrate), on which an epitaxial layer structure having the first conductivity type (e.g., n-type) is formed. A portion of this epitaxial layer structure (which may comprise one or more separate layers) functions as a drift region of the power semiconductor device. The device typically includes an "active region," which includes one or more power semiconductor devices that have a junction such as a p-n junction. The active region may be formed on and/or in the drift region. The active region acts as a main junction for blocking voltage in the reverse bias direction and providing current flow in the forward bias direction. The power semiconductor device may also have an edge termination in a termination region that is adjacent the active region. One or more power semiconductor devices may be formed on the substrate, and each power semiconductor device will typically have its own edge termination. After the substrate is fully processed, the resultant structure may be diced to separate the individual edge-terminated power semiconductor devices. The power semiconductor devices may have a unit cell structure in which the active region of each power semiconductor device includes a plurality of individual "unit cell" devices that are disposed in parallel to each other and that together function as a single power semiconductor device.

Power semiconductor devices are designed to block (in the forward or reverse blocking state) or pass (in the forward operating state) large voltages and/or currents. For example, in the blocking state, a power semiconductor device may be designed to sustain hundreds or thousands of volts of electric potential. However, as the applied voltage approaches or passes the voltage level that the device is designed to block, non-trivial levels of current may begin to flow through the power semiconductor device. Such current, which is typically referred to as "leakage current," may be highly undesirable. Leakage current may begin to flow if the voltage is increased beyond the design voltage blocking capability of the device, which may be a function of, among other things, the doping and thickness of the drift region. Leakage currents may also arise for other reasons, such as failure of the edge termination and/or the primary junction of the device. If the voltage applied to the device is increased past the breakdown voltage to a critical level, the increasing electric field may result in an uncontrollable and undesirable runaway generation of charge carriers within the semiconductor device, leading to a condition known as avalanche breakdown.

A power semiconductor device may also begin to allow non-trivial amounts of leakage current to flow at a voltage level that is lower than the designed breakdown voltage of the device. In particular, leakage current may begin to flow at the edges of the active region, where high electric fields may occur due to electric field crowding effects. In order to reduce this electric field crowding (and the resulting increased leakage currents), the above-mentioned edge terminations may be provided that surround part or all of the active region of a power semiconductor device. These edge terminations may spread the electric field out over a greater area, thereby reducing the electric field crowding.

Vertical power semiconductor devices that include a MOSFET transistor can have a standard gate electrode design in which the gate electrode of the transistor is formed on top of the semiconductor layer structure or, alternatively, may have the gate electrode buried in a trench within the semiconductor layer structure. MOSFETs having buried gate electrodes are typically referred to as gate trench MOSFETs. With the standard gate electrode design, the channel region of each unit cell transistor is horizontally disposed underneath the gate electrode. In contrast, in the gate trench MOSFET design, the channel is vertically disposed. Gate trench MOSFETs may provide enhanced performance, but typically require a more complicated manufacturing process.

SUMMARY

According to some embodiments of the present inventive concepts a method of forming a semiconductor device may be provided. The method may include forming a wide band-gap semiconductor layer structure on a substrate, the semiconductor layer structure including a drift region that has a first conductivity type; forming a plurality of gate trenches in an upper portion of the semiconductor layer structure, the gate trenches spaced apart from each other, each gate trench having a bottom surface, a first sidewall, a second sidewall, and an upper opening; forming an obstruction over a portion of each gate trench that partially obscures the upper opening; and implanting dopants having a second conductivity type that is opposite the first conductivity type into the bottom surfaces of the gate trenches, where the dopants implanted into the bottom surface of the gate trenches form deep shielding patterns.

In some embodiments, forming the obstruction includes depositing a first material layer and an oxide layer on an upper surface of the semiconductor layer structure; and oxidizing the first material layer. In some embodiments, the first material layer includes a polysilicon layer. In some embodiments, forming the obstruction includes: forming a mask oxide layer on an upper surface of the semiconductor layer structure; and performing isotropic etching of portions of the semiconductor layer structure underneath the mask oxide layer, resulting in undercut portions of the semiconductor layer structure. In some embodiments, the semiconductor layer structure includes a current spreading layer that has the first conductivity type located on an upper surface of the drift region. In some embodiments, the method may include forming a first source/drain contact on a first major surface of the semiconductor layer structure and forming a second source/drain contact on a second major surface of the semiconductor layer structure opposite the first surface. In some embodiments, the method may include forming gate structures within the respective gate trenches, where the gate structures each includes a gate oxide. In some embodiments, channel regions are formed in the respective first and second sidewalls of the gate trenches. In some embodiments, the semiconductor layer structure includes well regions having the second conductivity type, and where the channel regions are formed in the well regions. In some embodiments, the well regions are in the semiconductor layer structure, and the semiconductor layer structure is formed in a single epitaxial growth process. In some embodiments, a portion of the drift region between the well regions and the respective deep shielding patterns has the first conductivity type. In some embodiments, the wide band-gap semiconductor includes silicon carbide.

According to some embodiments of the present inventive concepts, a method of forming a semiconductor device may be provided. The method may include forming a wide band-gap semiconductor layer structure on a substrate, the semiconductor layer structure including a drift region that has a first conductivity type; forming a plurality of gate trenches in an upper portion of the semiconductor layer structure, the gate trenches spaced apart from each other, each gate trench having a bottom surface, a first sidewall, a second sidewall, and an upper opening; implanting dopants having the second conductivity type that is opposite the first conductivity type into the bottom surfaces and first and second sidewalls of the gate trenches, where the dopants implanted into the bottom surface of the gate trenches form deep shielding patterns; after implanting, oxidizing the first and second sidewalls of the gate trenches, resulting in oxidized portions of the first and second sidewalls of the gate trenches; and stripping the oxidized portions of the first and second sidewalls of the gate trenches.

In some embodiments, the semiconductor layer structure includes a current spreading layer that has the first conductivity type located on an upper surface of the drift region. In some embodiments, device widths of the trenches are the same as widths of the deep shielding regions. In some embodiments, the method may further include forming a first source/drain contact on a first major surface of the semiconductor layer structure and forming a second source/drain contact on a second major surface of the semiconductor layer structure opposite from the first surface. In some embodiments, the method may further include forming gate structures within the respective gate trenches, where the gate structures each include a gate oxide. In some embodiments, channel regions are formed in the respective first and second sidewalls of the gate trenches. In some embodiments, the semiconductor layer structure includes well regions having the second conductivity type, and where the channel regions are formed in the well regions. In some embodiments, the well regions are in the semiconductor layer structure, and where the semiconductor layer structure is formed in a single epitaxial growth process. In some embodiments, where the wide band-gap semiconductor includes silicon carbide.

According to some embodiments of the present inventive concepts, a method of forming a semiconductor device may be provided. The method may include forming a wide band-gap semiconductor layer structure on a substrate, the semiconductor layer structure including a drift region that has a first conductivity type; forming a plurality of gate trenches in an upper portion of the semiconductor layer structure, the gate trenches spaced apart from each other, each gate trench having a bottom surface, a first sidewall, a second sidewall, and an upper opening; implanting dopants having a second conductivity type that is opposite the first conductivity type into the bottom surfaces of the gate trenches, where the dopants implanted into the bottom surface of the gate trenches form deep shielding patterns; and implanting dopants having the first conductivity type into the sidewalls of the gate trenches.

In some embodiments, the semiconductor layer structure includes a current spreading layer that has the first conductivity type located on an upper surface of the drift region. In some embodiments, the dopants having the first conductivity type are implanted into the sidewalls of the gate trenches using an angled ion implant. In some embodiments, the semiconductor device is a vertical semiconductor device. In some embodiments, the method may further include forming a first source/drain contact on a first major surface of the semiconductor layer structure and forming a second source/drain contact on a second major surface of the semiconductor layer structure opposite from the first surface. In some embodiments, the method may further include forming gate structures within the respective gate trenches, where the gate structures each include a gate oxide. In some embodiments, channel regions are formed in the respective first and second sidewalls of the gate trenches. In some embodiments, the semiconductor layer structure includes well regions having the second conductivity type, and the channel regions are formed in the well regions. In some embodiments, the well regions are in the semiconductor layer structure, and the semiconductor layer structure is formed in a single epitaxial growth process. In some embodiments, the wide band-gap semiconductor includes silicon carbide.

According to some embodiments of the present inventive concepts, a method of forming a semiconductor device may be provided. The method may include forming a wide band-gap semiconductor layer structure on a substrate, the semiconductor layer structure including a drift region that has a first conductivity type; implanting dopants having a second conductivity type that is opposite the first conductivity type into the drift region, forming deep shielding patterns; and forming a plurality of gate trenches in an upper portion of the semiconductor layer structure, the gate trenches extending into the deep shielding patterns, the gate trenches spaced apart from each other, and each gate trench having a bottom surface, a first sidewall, a second sidewall, and an upper opening.

In some embodiments, the semiconductor device is a vertical semiconductor device. In some embodiments, the method may include forming a first source/drain contact on a first major surface of the semiconductor layer structure and forming a second source/drain contact on a second major surface of the semiconductor layer structure opposite from the first surface. In some embodiments, the method may include forming gate structures within the respective gate trenches, where each gate structure includes a gate oxide. In some embodiments, each gate trench is offset from a center of the respective deep shielding pattern. In some embodiments, the method the semiconductor layer structure includes well regions having the second conductivity type, and each deep shielding pattern may be in contact with a respective well region having the second conductivity type. In some embodiments, the well regions are in the semiconductor layer structure, and the semiconductor layer structure may be formed in a single epitaxial growth process. In some embodiments, the wide band-gap semiconductor includes silicon carbide.

According to some embodiments of the present inventive concepts a device may be provided. The device may include: a wide band-gap semiconductor layer structure on a substrate, the semiconductor layer structure including a drift region that has a first conductivity type; a plurality of gate trenches in an upper portion of the semiconductor layer structure, each gate trench having a bottom surface, a first sidewall, a second sidewall, and an upper opening; and a plurality of deep shielding patterns, each deep shielding pattern having implanted ions of a second conductivity type that is opposite the first conductivity type, each deep shielding pattern within the semiconductor layer structure and below a respective gate trench of the plurality of gate trenches, where a portion of the drift region adjacent to each first and second sidewall includes implanted ions of the first conductivity type.

In some embodiments, the implanted ions of the first conductivity type may be implanted into the lower region of each first and second sidewall at an angle. The angle may be between 5 and 45 degrees with respect to a line perpendicular to an upper surface of the semiconductor layer structure that is opposite the substrate. In some embodiments, the device may include a first source/drain contact on a first major surface of the semiconductor layer structure and a second source/drain contact on a second major surface of the semiconductor layer structure opposite from the first surface. In some embodiments, the device may include gate structures within respective gate trenches, where each gate structure includes a gate oxide. In some embodiments, the device may include a current spreading layer that has the first conductivity type located on an upper surface of the drift region. In some embodiments, the semiconductor layer structure may include well regions having the second conductivity type.

According to some embodiments of the present inventive concepts, a device may be provided. The device may include: a wide band-gap semiconductor layer structure on a substrate, the semiconductor layer structure including a drift region that has a first conductivity type and a current spreading layer that has the first conductivity type located on an upper surface of the drift region; a plurality of gate trenches in an upper portion of the semiconductor layer structure, each gate trench having a bottom surface, a first sidewall, a second sidewall, and an upper opening; and a plurality of deep shielding patterns, each deep shielding pattern having implanted ions of a second conductivity type that is opposite the first conductivity type, each deep shielding pattern within the semiconductor layer structure and below a respective gate trench of the plurality of gate trenches. A lower surface of the current spreading layer may be farther from the substrate than the bottom surfaces of the gate trenches.

In some embodiments, the device may include a first source/drain contact on a first major surface of the semiconductor layer structure and a second source/drain contact on a second major surface of the semiconductor layer structure opposite from the first surface. In some embodiments, the device gate structures within respective gate trenches, where each gate structure includes a gate oxide. In some embodiments, the semiconductor layer structure includes well regions having the second conductivity type. In some embodiments, the wide band-gap semiconductor includes silicon carbide.

BRIEF DESCRIPTION OF THE DRAWINGS

FIGS. 2A-2C are schematic cross-sectional diagram of a first related art approach addressing issues presented by the gate trench power MOSFET of FIG. 1B.

FIGS. 3A-3C are schematic cross-sectional diagram of a second related art approach addressing issues presented by the gate trench power MOSFET of FIG. 1B.

FIGS. 4A-4F are schematic cross-sectional diagrams illustrating operations within methods of forming a gate trench power MOSFET according to embodiments of the present inventive concepts.

FIGS. 5A-5C are schematic cross-sectional diagrams illustrating operations within methods of forming a gate trench power MOSFET according to embodiments of the present inventive concepts.

FIGS. 6A-6C are schematic cross-sectional diagrams illustrating operations within methods of forming a gate trench power MOSFET according to embodiments of the present inventive concepts.

FIGS. 7A-7C are schematic cross-sectional diagrams illustrating operations within methods of forming a gate trench power MOSFET according to embodiments of the present inventive concepts.

FIGS. 8A-8F are schematic cross-sectional diagrams illustrating operations within methods of forming a gate trench power MOSFET according to embodiments of the present inventive concepts.

FIGS. 9A-9D are schematic cross-sectional diagrams illustrating operations within methods of forming a gate trench power MOSFET according to embodiments of the present inventive concepts.

FIGS. 11A-11F are schematic cross-sectional diagrams illustrating operations within methods of forming a gate trench power MOSFET according to embodiments of the present inventive concepts.

FIGS. 12A-12C are schematic cross-sectional diagrams illustrating operations within methods of forming a gate trench power MOSFET according to embodiments of the present inventive concepts.

FIGS. 13A-13C are schematic cross-sectional diagrams illustrating operations within methods of forming a gate trench power MOSFET according to embodiments of the present inventive concepts.

FIGS. 14A-14C are schematic cross-sectional diagrams illustrating operations within methods of forming a gate trench power MOSFET according to embodiments of the present inventive concepts.

DETAILED DESCRIPTION

SiC gate trench MOSFET vertical power devices are attractive due to their inherent lower specific on-resistance, which may result in more efficient operation for power switching operations requiring low-to-moderate reverse blocking voltage levels (e.g., 650-1200V). Trench MOSFET vertical power devices may exhibit a lower specific resistance during on-state operation since the channel is formed on the sidewall of the gate trench, and the trench design reduce the overall pitch of the device, allowing for increased integration. Moreover, the carrier mobility in the sidewall channel of a trench MOSFET has been found to be 2-4 times higher than the corresponding carrier mobility in the channel of a planar (e.g., lateral structure) device. This increased carrier mobility also enhances the current density. However, SiC gate trench MOSFET vertical power devices may experience oxide reliability issues, due to the presence of sharp high-field corners at bottom edges of the trench that can break down the gate oxide over time, eventually resulting in failure of the device.

Figure 1A:
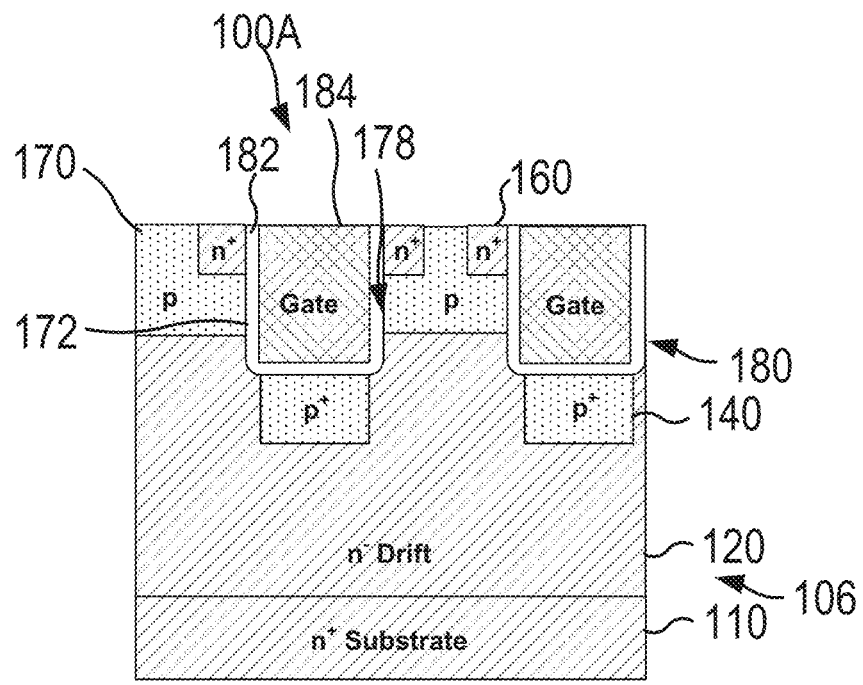
FIG. 1A is a schematic cross-sectional diagram of a gate trench power MOSFET showing an ideal gate trench and implant shield.

FIG. 1A is a schematic cross-sectional diagram of a first wide band-gap power MOSFET 100A. As shown in FIG. 1A, the power MOSFET 100A includes a heavily-doped (n$^+$) n-type silicon carbide substrate 110. A lightly-doped (n$^-$) silicon carbide drift region 120 is provided on the substrate 110. A moderately-doped p-type silicon carbide layer 170 is formed on the upper surface of the n-type drift region 120. The moderately-doped p-type silicon carbide layer 170 may be formed, for example, by epitaxial growth. This moderately-doped p-type silicon carbide layer 170 may provide p-wells 172 for the device 100. The transistor channels may be formed in the p-wells 172, as will be discussed below. A heavily-doped n$^+$ silicon carbide source layer 160 may be formed in an upper region of the p-type silicon carbide layer 170. The heavily-doped n$^+$ silicon carbide source layer 160 may be formed for example, by ion implantation.

The substrate 110, drift region 120, the moderately doped p-type layer 170, and the heavily-doped n$^+$ silicon carbide source layer 160, along with the various regions/patterns formed therein, comprise a semiconductor layer structure 106 of the MOSFET 100A.

Gate trenches 180 are formed in the semiconductor layer structure 106. The gate trenches 180 may extend through the heavily-doped n$^+$ silicon carbide source layer 160 and the moderately-doped p-type layer 170 and into the drift region 120. A gate insulating layer 182 may be formed on the bottom surface and sidewalls of each gate trench 180. A gate electrode 184 may be formed on each gate insulating layer 182 to fill the respective gate trenches 180. Vertical channel regions 178 are provided in the p-wells 172 adjacent the gate insulating layer 182.

Source contacts (not shown) may be formed on the heavily-doped n-type source regions 160. A drain contact (not shown) may be formed on the lower surface of the substrate 110. A gate contact (not shown) may be formed on the gate electrode 184.

If the gate insulating layer 182, which is typically implemented as a silicon oxide layer, is subjected to overly high electric fields, the gate insulating layer 182 can degrade over time and eventually fail to insulate the gate electrode 184 from the underlying current spreading layer 130 or drift region 120, which can result in device failure. The corners of the gate insulating layer 182 (e.g., the areas where the gate insulating layer 182 transition from vertical surfaces to lateral surfaces) are particularly susceptible to such high electric fields. To improve reliability of the gate insulating layer 182, the power MOSFET 100 includes a deep shielding pattern 140 under the gate trench 180. The deep shielding pattern 140 may be a heavily-doped (p$^+$) silicon carbide pattern that is formed in the upper surface of the n-type drift region 120 by ion implantation.

The deep shielding pattern 140 may be very effective in protecting the corners of the gate insulating layer 182 from high electric fields during reverse blocking operation. The deep shielding pattern 140 is particularly preferred over other schemes for guarding the gate insulating layer 182 as it provides aggressive cell pitch reduction and enhanced device performance resulting from utilization of two sidewall faces for current conduction.

The deep shielding pattern 140 of power MOSFET 100A may be formed subsequent to formation of the gate trench 180 and prior to formation of the gate insulating layer 182 and the gate electrode 184 therein. Ion implantation may be used to form the deep shielding patterns 140. The depth at which the ions are implanted is directly related to the energy of the implant, i.e., ions implanted into a semiconductor layer at higher energies tend to go deeper into the layer. Thus, forming the deep shielding patterns (which may have a thickness of 1-5 microns) via ion implantation requires high energy implants.

When dopant ions are implanted into a semiconductor layer, the ions damage the crystal lattice of the semiconductor layer, and this damage typically can only be partly repaired by thermal annealing. Moreover, the amount of lattice damage is also directly related to the implant energy, with higher energy implants tending to cause more lattice damage than lower energy implants, and the uniformity of the ion implant also tends to decrease with increasing implant depth. Thus, to form implanted regions that have good doping uniformity by depth and/or acceptable levels of lattice damage, it may be necessary to perform a multiple successive epitaxial growth/ion implantation steps to form a deep implant. This may significantly increase the complexity and cost of the manufacturing process and may not be a commercially viable option in many instances.

Figure 1B:
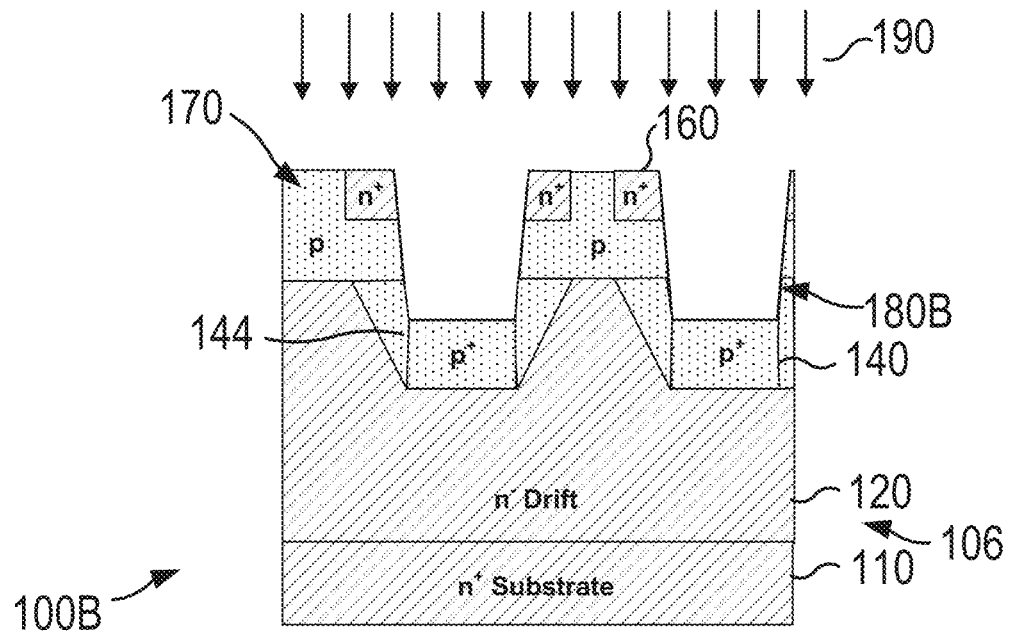
FIG. 1B is a schematic cross-sectional diagram of a gate trench power MOSFET showing a gate trench and implant shield that may result in an exposed channel and drift region.
Figure 9D:
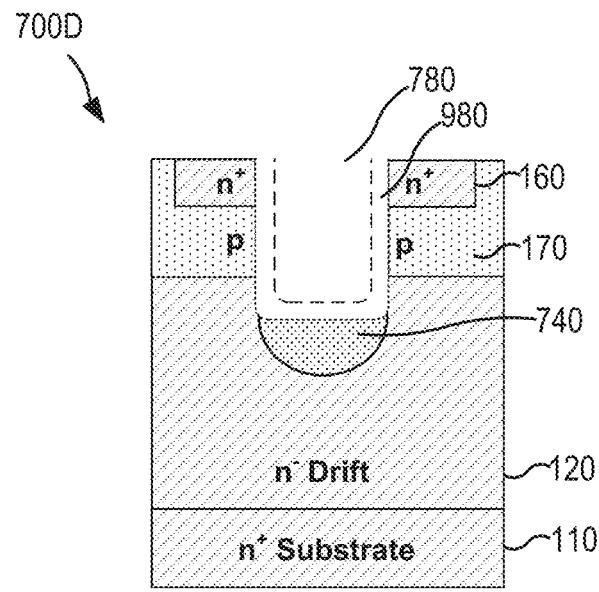

Moreover, formation of the deep shielding pattern 140 may be challenging, due to anisotropic etching of the silicon carbide layers 160, 170 and 120 during formation of the gate trench 180. Where FIG. 1A illustrates an ideal trench 180 and deep shielding pattern 140, FIG. 1B is a schematic cross-sectional view of a power MOSFET 100B during formation of the deep shielding pattern 140 via ion implantation 190 that may result from current formation techniques. As can be seen, the sidewalls of the trench 180B are angled (i.e., not vertical) due to the anisotropic etching, and upper portions of the drift region 120 that are exposed by the trench are implanted during formation of the p$^+$ deep shielding pattern 140. As the lightly-doped (n$^-$) drift region 120 is doped with a comparatively lower (e.g., orders of magnitude lower) concentration of ions than the heavily-doped (p$^+$)

deep shielding pattern 140, the n-type dopants in the upper portions of the drift region 120 may be compensated by the unintended doping of p-type dopants into the trench sidewalls that can occur during the ion implantation step used to form the deep shielding pattern 140. This can result in an increase in the JEFT resistance and, in some cases, as shown in FIG. 1B, the p-type type dopants may completely overwhelm the background n-type doping of the drift region 120 so that p-type pinch regions 144 are formed which connect the heavily-doped (p⁺) deep shielding pattern 140 to the moderately-doped p-type layer 170. If this occurs, the current flow is pinched off, rendering power MOSFET 100B unusable or severely degraded in performance.

Present approaches to ensure that the sidewalls of drift region 120 that are exposed by the trench 180 between the p-well 172 and the deep shielding pattern 140 are not unintentionally doped with p-type dopants during formation of the deep shielding pattern 140 are described below with reference to FIGS. 2A-3C. FIGS. 2A-2C illustrate 200A through 200C, respectively, of a first related art approach of forming a power MOSFET that addresses the issues presented by the gate trench power MOSFET of FIG. 1B. Prior to operation 200A illustrated in FIG. 2A, a trench etch oxide mask 210 may be formed on upper surfaces of the device, and the gate trench 180 may be formed by etching. In operation 200A of FIG. 2A, and with the trench etch oxide mask 210 still present, a sidewall oxide mask 220 may be formed by oxidizing portions of the heavily-doped n⁺ silicon carbide source layer 160, the moderately-doped p-type layer 170, and the lightly-doped n silicon carbide drift region 120 that are exposed by the gate trench 180. This sidewall oxide mask may be formed by thermally oxidizing the heavily-doped n⁺ silicon carbide source layer 160, the moderately-doped p-type layer 170, and the lightly-doped n silicon carbide drift region 120.

In operation 200B illustrated in FIG. 2B, ion implantation 190 may be performed to implant the heavily-doped (p⁺) silicon carbide deep shielding pattern 240 within the portion of the lightly-doped n⁻ silicon carbide drift region 120 that is exposed at the bottom of the trench 180. The ion implantation 190 may also be performed on the exposed surfaces of the trench etch oxide mask 210 and the sidewall oxide mask 220, resulting in a portion 211 of the trench etch oxide mask 210 and a portion 221 of the sidewall oxide mask 220 being implanted with p-type dopants.

In operation 200C illustrated in FIG. 2C, the oxide masks 210 and 220 may be stripped, along with the portions 211 and 221, respectively, that were subjected to ion implantation in operation 200B. The removal of the oxide masks 210 and 220 ensures that the portions 120S of the lightly-doped n⁻ silicon carbide drift region 120 that are exposed by the trench are not counter-doped with p-type dopants, and thus the problems of power MOSFET 100B of FIG. 1B may be avoided.

One advantage of the approach of FIGS. 2A-2C is that when the device is formed on a SiC wafer having the (0001) face exposed, crystal orientation effects will cause the sidewall oxide mask 220 to form much more quickly than the oxide that forms on the portion of the drift region 120 that is exposed at the bottom of the gate trench 180. On the other hand, disadvantages of the approach of FIGS. 2A-2C are that the resultant gate trench 180W that is formed subsequent to operation 200C is wider and deeper than the original gate trench 180 formed prior to operation 200A in FIG. 2A. As a result, a width of the deep shielding pattern 240 is less than a width of the gate trench 180, which means that the deep shielding pattern 240 will not extend to cover the bottom corners of a gate insulating layer that is subsequently formed in the gate trench 180W, and hence the deep shielding pattern provides less protection to the most vulnerable portion of the gate insulating layer. Also, the formation of sidewall oxide mask 220 in operation 200A may result in ledge surfaces 220L (see FIG. 2A) which in operation 200B may scatter implants in unintended directions resulting, for example, in heavier p-type doping of the channel regions (which requires thicker sidewall oxide masks 220, further widening the resultant gate trench 180W).

FIGS. 3A-3C illustrate a second related art approach of a method of forming a power MOSFET that addresses issues presented by the gate trench power MOSFET of FIG. 1B. Prior to operation 300A illustrated in FIG. 3A, a trench etch oxide mask 210 is formed on upper surfaces of heavily-doped n⁺ silicon carbide source layer 160 and moderately-doped p-type layer 170, and the gate trench 180 is formed by etching. In operation 300A of FIG. 3A, and with the trench etch oxide mask 210 still present, a sidewall oxide mask 320 may be formed by depositing a mask material (e.g., SiO₂) on the portions of the heavily-doped n⁺ silicon carbide source layer 160, the moderately-doped p-type layer 170, and the lightly-doped n⁻ silicon carbide drift region 120 that are exposed by the gate trench 180 and on the upper surfaces of trench etch oxide mask 210.

In operation 300B illustrated in FIG. 3B, ion implantation 190 may be performed to implant the heavily-doped (p⁺) silicon carbide deep shielding pattern 340 within the lightly-doped n silicon carbide drift region 120. The ion implantation 190 may also be performed on the exposed surfaces of the trench etch oxide mask 210 and the sidewall oxide mask 320, resulting in a portion of the trench etch oxide mask 210 and a portion 321 of the sidewall oxide mask 220 being implanted with ions.

In operation 300C illustrated in FIG. 3C, the oxide masks 210 and 320 may be stripped, along with the portions thereof that were subjected to ion implantation in operation 300B. As with the operations of FIGS. 2A-2C, the removal of the oxide masks 210 and 320 results in portions 120S of the lightly-doped n⁻ silicon carbide drift region 120 that are unaffected by the heavily-doped (p⁺) silicon carbide deep shielding pattern 340, and thus the problems of power MOSFET 100B of FIG. 1B may be avoided.

The approach of FIGS. 3A-3C provide an advantage in that the resultant gate trench subsequent to operation 300C of FIG. 3C has the same width as the original gate trench 180 etched prior to operation 300A of FIG. 3A, because, unlike operations 200A-C, no material of the drift region 120, the p-type layer 170, and the source layer 160 is thermally oxidized. Ledge surfaces similar to surfaces 200L are also advantageously avoided. However, a disadvantage of the approach of FIGS. 3A-3C is that deposition of the sidewall mask material to form sidewall oxide mask 320 may result in a thicker mask applied to the bottom of the gate trench 180 (e.g., on the upper surface of the drift region 120 exposed by the gate trench 180) than along the sidewalls of the gate trench 180. This thicker mask in the bottom of gate trench 180 may block implantation of the ions used to form the heavily-doped (p⁺) silicon carbide deep shielding pattern 340 to a potentially unacceptable degree. Thinning the sidewall oxide mask 320 (e.g., by depositing less material), on the other hand, may potentially require a re-etch of the gate trench 180 to remove implanted material in the sidewalls of the drift region 120, the p-type layer 170, and the source layer 160, again resulting in a wider and deeper gate trench than the original gate trench 180 formed prior to operation 300A in FIG. 3A.

Pursuant to embodiments of the present invention, gate trench wide band-gap power semiconductor devices such as power MOSFETs and power IGBTs are provided that have deep trench shielding patterns underneath the gate trenches that are formed via new approaches that ensure that the n-type drift region between the p-well channel and the p-type deep trench shielding pattern is not unduly affected by the formation of the deep trench shielding pattern. These approaches reduce or avoid the disadvantages of the approaches of FIGS. 2A-C and 3A-C.

The new approaches for forming deep shielding patterns disclosed herein allow the formation of deep shielding patterns that reduce or even eliminate implanted p-type dopants in portions of the drift region that are between the p-well channel and the deep shielding pattern. Thus, the devices according to embodiments of the present invention may exhibit increased performance as compared to devices formed using the technique discussed above with respect to the power MOSFET 100B of FIG. 1B. Moreover, the approaches according to embodiments of the present invention may avoid wider and/or deeper gate trenches as in FIGS. 2A-C, or the difficulties in forming the deep shielding pattern that occur as in FIGS. 3A-C.

Embodiments of the present invention will now be described with reference to FIGS. 4A-19. It will be appreciated that features of the different embodiments disclosed herein may be combined in any way to provide many additional embodiments. Thus, for example, features of any MOSFET embodiment described herein may be incorporated into IGBT embodiments, and vice versa. Thus, it will be appreciated that various features of the inventive concepts are described below with respect to specific examples, but that these features may be added to other embodiments and/or used in place of example features of other embodiments to provide many additional embodiments. Thus, the present invention should be understood to encompass these different combinations.

FIGS. 4A-4F are schematic cross-sectional diagrams that illustrate operations 400A-400F, respectively, of a method of fabricating a gate trench power MOSFET according to embodiments of the present inventive concepts.

Referring first to FIG. 4A, in an operation 400A a heavily-doped (n$^+$) n-type silicon carbide substrate 410 is provided. A lightly-doped (n$^-$) silicon carbide drift region 420 is formed on the substrate 410 via epitaxial growth. A moderately-doped p-type layer 470 is formed on the upper surface of the n-type silicon carbide drift region 420. A heavily-doped (n$^+$) n-type silicon carbide region 464 is formed in an upper region of the moderately-doped p-type layer 470 via ion implantation. The silicon carbide region 464 may be a source region. The layers 410, 420, 470 may all be grown in a single epitaxial growth process with process stops to switch between n-type doping and p-type doping. The layers 410, 420, 470, 464 comprise a semiconductor layer structure 406.

Referring to FIG. 4B, in an operation 400B a polysilicon layer 450 and an oxide layer 455 may be deposited on top of the upper surface of the semiconductor layer structure 406. The polysilicon layer 450 and the oxide layer 455 may act as a silicon carbide trench etch mask. The oxide layer 455 may be a silicon dioxide (SiO$_2$) layer.

Referring to FIG. 4C, in an operation 400C the polysilicon layer 450 and the oxide layer 455 may be patterned using a photoresist mask (not shown). In some embodiments, this patterning may be performed in a dry plasma condition.

Referring to FIG. 4D, in an operation 400D a gate trench 480 may be etched into the upper surface of the semiconductor layer structure 406. Although only one gate trench 480 is shown in FIG. 4D, it will be appreciated that a plurality of gate trenches 480 are typically provided, where each gate trench 480 extends in a first direction (e.g., from an upper surface of the n-type silicon carbide layer 464 toward the substrate 410, and the gate trenches 480 are spaced apart from each other in a second direction so that the gate trenches 480 extend in parallel to each other. Each gate trench 480 may extend through the heavily-doped n-type silicon carbide layer 464 in order to convert the silicon carbide layer 464 into a plurality of spaced apart regions 464' that will ultimately serve as the source regions 460 of the power MOSFET. Each gate trench 480 may also extend through the moderately-doped p-type silicon carbide layer 470 in order to convert layer 470 into a plurality of p-wells 472. Each gate trench 480 may also extend into an upper surface of the n-type drift region 420. As can be seen in FIG. 4D, the etching of the gate trench 480 may result in non-parallel sidewall surfaces thereof. In other words, the sidewalls may be angled with respect to a normal (perpendicular) line to an upper surface of the substrate 410.

Referring to FIG. 4E, in an operation 400E the polysilicon layer 450 may be oxidized via an anneal in an oxygen containing environment, resulting in an extrusion of oxide 455 to form an overhang mask 452. In other words, the oxidation operation may result in the reaction of the silicon of the polysilicon layer 450 with the introduced oxygen to cause a volume expansion of the oxide 455. The overhang mask 452 may at least partially obstruct the gate trench 480.

Referring to FIG. 4F, in an operation 400F a heavily-doped p-type silicon carbide deep shielding pattern 440 may be formed underneath the gate trench 480 via an ion implantation step 190. The presence of the overhang mask 452 inhibits implantation of ions into the sidewalls of the plurality of spaced apart regions 464', the p-wells 472, and the sidewalls of the n-type drift region 420 that are exposed by the gate trench 480. Subsequent to operation 400F, the oxide 455 and the polysilicon layer 450 may be removed and further processing may be performed (e.g., forming the gate insulating layer, gate electrodes, and contacts) to form the power MOSFET.

Advantageously, the operations 400A-400F of FIGS. 4A-4D avoid the disadvantages of FIGS. 2A-3C discussed above, and do not result in a modification to the size (width or depth) of the gate trench 480 that is etched into the structure 406. The use of the overhang mask 452 may act to block implants into the sidewalls of the trench 480.

FIGS. 5A-5C are schematic cross-sectional diagrams illustrating operations within methods of forming a gate trench power MOSFET according to embodiments of the present inventive concepts. In operations 500A-500C of FIGS. 5A-5C, ion implantation may be performed into a gate trench 580 that has been modified using an isotropic etch that creates an undercut region of the trench with respect to the trench etch mask material.

Prior to operation 500A illustrated in FIG. 5A of a method of forming a power MOSFET, a trench etch oxide mask 510 may be formed on upper surfaces of the heavily-doped n$^+$ silicon carbide source region 160 and the moderately-doped p-type layer 170, and the gate trench 580 may be formed by an etching operation. In operation 500A of FIG. 5A, and with the trench etch oxide mask 510 still present, an additional etching operation may be performed. The additional etching operation may be an isotropic etch that expands the width and the depth of the gate trench 580, resulting in undercut regions 510U being formed. These undercut regions may provide overhangs over the sidewalls of the heavily-doped n+ silicon carbide source layer 160, the moderately-doped p-type layer 170, and the lightly-doped n silicon carbide drift region 120 that are exposed by the gate trench 580. The trench etch oxide mask 510, which may not be etched during the isotropic etch, may at least partially obstruct sidewalls of the gate trench 180 that is widened by the isotropic etching.

In operation 500B illustrated in FIG. 5B, an ion implantation process 190 may be performed to form a heavily-doped (p+) silicon carbide deep shielding pattern 540 in the silicon carbide drift layer 520 underneath the gate trench 580. The overhanging portions of the trench etch oxide mask 510 may reduce or eliminate implantation of p-type dopants into the sidewalls of the heavily-doped n+ silicon carbide source layer 160, the moderately-doped p-type layer 170, and the lightly-doped n− silicon carbide drift region 120 that are exposed by the gate trench 580.

In operation 500C illustrated in FIG. 5C, the oxide mask 510 may be stripped. Since the overhanging portions of the trench etch oxide mask 510 reduced or eliminated the implantation of p-type dopants into the sidewalls of the gate trench 580, the portions 120S of the lightly-doped n− silicon carbide drift region 120 that are between the moderately-doped p-type layer 170 and the heavily-doped (p+) silicon carbide deep shielding pattern 540 may have suitable n-type conductivity, and thus the problems of power MOSFET 100B of FIG. 1B may be avoided. In some embodiments, a slight re-etch, or oxidation and strip of the gate trench 180 subsequent to operation 500C may be performed to remove a thin layer of the regions 120S that may have some amount of p-type dopants implanted therein due to implant recoils. The width of the deep shielding pattern 540 may also be the same as the width of the gate trench 580 so that the deep shielding pattern 540 may effectively shield the bottom corners of a gate insulating layer that is formed in the gate trench 580 in a subsequent operation.

FIGS. 6A-6C are schematic cross-sectional diagrams illustrating operations within methods of forming a gate trench power MOSFET according to embodiments of the present inventive concepts. In operations 600A-600C of FIGS. 6A-6C, ion implantation may be performed into a gate trench 580 without formation of an intentional sidewall mask (e.g., sidewall oxide masks 220 or 320 of FIGS. 2A-3C.

Prior to operation 600A illustrated in FIG. 6A of a method of forming a power MOSFET, a trench etch oxide mask 610 may be formed on upper surfaces of a heavily-doped n+ silicon carbide source region 160 and on a moderately-doped p-type layer 170, and the gate trench 680 may be formed by an etching operation. In operation 600A of FIG. 6A, and with the trench etch oxide mask 610 still present, ion implantation 190 may be performed. This may result in ions being implanted in the portions of the heavily-doped n+ silicon carbide source layer 160, the moderately-doped p-type layer 170, and the lightly-doped n− silicon carbide drift region 120 that are exposed by the gate trench 680. The trench etch oxide mask 610 is made sufficiently thick so that a portion 611 thereof is not implanted with ions. The ion implantation step 190 results in formation of a heavily-doped (p+) silicon carbide deep shielding pattern 640.

In operation 600B illustrated in FIG. 6B, an oxidation process may be performed to consume the sidewalls of the heavily-doped n+ silicon carbide source region 160, the moderately-doped p-type layer 170, and the lightly-doped n silicon carbide drift region 120 that were implanted with ions in operation 600A. The oxidation process may be, for example, a thermal oxidation process. The oxidation process may result in oxidized sidewall portions 661 of the heavily-doped n+ silicon carbide source layer 160, oxidized sidewall portions 671 of the moderately-doped p-type layer 170, and oxidized sidewall portions 621 of the lightly-doped n− silicon carbide drift region 120, as well as oxidation of the top portion 641 of the heavily-doped (p+) silicon carbide deep shielding pattern 640.

In operation 600C illustrated in FIG. 6C, the oxide mask 510 and the oxidized sidewall portions 661, 671, 621 and 641 may be stripped. The removal of the oxide mask and the oxidized sidewall portions 661, 671, and 621 results in portions 120S of the lightly-doped n silicon carbide drift region 120 that are unaffected by the heavily-doped (p+) silicon carbide deep shielding pattern 640, and thus the problems of power MOSFET 100B of FIG. 1B may be avoided. The width of the deep shielding pattern 640 may also be the same as the width of the gate trench 680 so that the deep shielding pattern 640 may effectively shield the bottom corners of a gate insulating layer that is formed in the gate trench 680 in a subsequent operation.

The operations 600A-600C may advantageously condition, smooth, and/or clean the sidewalls of the gate trench 680 that is provided simultaneously with the formation of the heavily-doped (p+) silicon carbide deep shielding pattern 640 and the removal of the oxide mask 610. Previous methods of forming power MOSFETs may not perform such conditioning, smoothing, and/or cleaning, or may perform such conditioning, smoothing, and/or cleaning as separate operations. As such, the operations 600A-600C may provide advantages over previous methods of forming power MOSFETs and/or may reduce an overall number of operations performed in formation of power MOSFETs.

FIGS. 7A-7C are schematic cross-sectional diagrams illustrating operations within methods of forming a gate trench power MOSFET according to embodiments of the present inventive concepts. In operations 700A-700C of FIGS. 7A-7C, ion implantation may be performed into a gate trench 780 without formation of an intentional sidewall mask (e.g., sidewall oxide masks 220 or 320 of FIGS. 2A-3C).

Operation 700A of FIG. 7A may be similar to operation 600A of FIG. 6A. Thus, prior to operation 700A illustrated in FIG. 7A of a method of forming a power MOSFET, a trench etch oxide mask 710 may be formed on upper surfaces of heavily-doped n+ silicon carbide source regions 160 and moderately-doped p-type layer 170, and the gate trench 780 may be formed by an etching operation. In operation 700A of FIG. 7A, and with the trench etch oxide mask 710 still present, ion implantation 190 may be performed. This may result in ions being implanted in portions of the heavily-doped n+ silicon carbide source regions 160, the moderately-doped p-type layer 170, and the lightly-doped n silicon carbide drift region 120 that are exposed by the gate trench 780. The trench etch oxide mask 710 is made sufficiently thick so that a portion 711 thereof is not implanted with ions. The ion implantation step 190 results in formation of a heavily-doped (p+) silicon carbide deep shielding pattern 740.

In operation 700B illustrated in FIG. 7B, ion implantation 790 of an opposite doping type may be performed to compensate for the undesired doping of the sidewalls of the gate trench 780 that occurred during ion implantation step 190. The ion implantation 790 may be performed at an angle, whereas the ion implantation 190 of operation 700A of FIG. 7A may be performed perpendicular (e.g., normal to) the structure 706. In other words, the n-type doping may be performed to compensate for light p-type doping of the sidewalls of gate trench 780 that occurred during ion implantation step 190 in order to return the exposed sidewalls 761 of the silicon carbide source layer 160, the exposed sidewalls 771 of the p-type layer 170, and the exposed sidewalls 721 of the lightly-doped n silicon carbide drift region 120 to their original dopant concentrations (e.g., prior to ion implantation 190 of operation 700A of FIG. 7A).

Operation 700C of FIG. 7C may be similar to operation 600C of FIG. 6C. In operation 700C illustrated in FIG. 7C, the oxide mask 710 may be stripped. As a result of operations 700A-700C, the silicon carbide deep shielding pattern 740 may be formed underneath the gate trench 780 and the portions 720S of the lightly-doped n⁻ silicon carbide drift region 120 that are between the p-wells and the silicon carbide deep shielding pattern 740 may have suitable n-type conductivity. As such, the problems of power MOSFET 100B of FIG. 1B may be avoided.

The angled ion implantation in operation 700B of FIG. 7B may be applied to the result of operations 400A-400F in FIGS. 4A-4F and/or to the operations 500A-500C of FIGS. 5A-5C in order to return the regions of drift region 120 below the p-well to a n-type region should inadvertent ion implantation in these regions occur. In other words, the operations of FIG. 7B may be used in conjunction with the operations of the previously described embodiments.

As a result of the operations 700A-C of FIGS. 7A-C, a device may be formed. The device may include a wide band-gap semiconductor layer structure on a substrate 110, the semiconductor layer structure including a drift region 120 that has a first conductivity type, as well as a plurality of gate trenches 180 in an upper portion of the semiconductor layer structure. Each gate trench may have a bottom surface, a first sidewall, a second sidewall, and an upper opening. A portion of the drift region 720S may have implanted ions of the first conductivity type. A plurality of deep shielding patterns 740 may also be in the device, with each deep shielding pattern 740 within the semiconductor layer structure and below a respective gate trench 180 of the plurality of gate trenches 180. Each deep shielding pattern 140 may have implanted ions of a second conductivity type that is opposite the first conductivity type.

FIGS. 8A-8F are schematic cross-sectional diagrams illustrating operations within methods of forming a gate trench power MOSFET according to embodiments of the present inventive concepts. As seen in FIG. 8A, in operation 800A, the heavily-doped (p⁺) silicon carbide deep shielding pattern 840 may be formed prior to formation of the gate trench 780. In operation 800A a heavily-doped (n⁺) n-type silicon carbide substrate 810 is provided. A lightly-doped (n⁻) silicon carbide drift region 820 is formed on the substrate 810 via epitaxial growth. A moderately-doped p-type layer 870 and a heavily-doped (p⁺) silicon carbide deep shielding pattern 840 are formed on the upper surface of the n-type silicon carbide drift region 820. A heavily-doped (n⁺) n-type silicon carbide region 864 is formed in an upper portion of the moderately-doped p-type layer 870 via ion implantation. The silicon carbide region 864 may be a source layer in some embodiments. The layers 810, 820, 840, 870 may all be grown in a single epitaxial growth process with process stops to switch between n-type doping and p-type doping to form a semiconductor layer structure 806.

Referring to FIG. 8B, in an operation 800B a gate trench 880 may be etched into the upper surface of the semiconductor layer structure 806. Although only one gate trench 880 is shown in FIG. 8B, there may be a plurality of gate trenches 880 each extending in a first direction (e.g., from an upper surface of the n-type silicon carbide layer 864 toward the substrate 810 that are spaced apart from each other in a second direction. The gate trenches 880 may extend in parallel to each other. Each gate trench 880 may extend through the heavily-doped n-type silicon carbide region 864 in order to convert the silicon carbide region 864 into a plurality of spaced apart regions 864'. These regions 864' that will ultimately serve as the source regions 860 of the power MOSFET. Each gate trench 880 may also extend through the moderately-doped p-type silicon carbide layer 870 in order to convert layer 870 into a plurality of p-wells 872. Each gate trench 880 may also extend into an upper surface of the p-type deep shielding layer 840 and into an upper surface of the n-type drift region 820.

In operation 800C, a gate electrode 882 and gate oxide 882 may be formed in the gate trench 880.

FIGS. 8D-8F show that, in some embodiments, the gate trench may be etched offset from a center or central portion of the deep shielding layer 840, resulting in contact between a p-well 872 on one side of the gate trench 880 and the deep shielding layer 840. However, on the opposite side of the gate trench 880, a portion of the drift region between the p-well 872 and the deep shielding layer 840 remains n-type, and thus functionality of the power MOSFET may be retained. Stated differently in some embodiments the heavily-doped (p⁺) silicon carbide deep shielding pattern 840. In particular, as shown in FIG. 8D, the heavily-doped (p⁺) silicon carbide deep shielding pattern 840 may extend farther to the left than the heavily-doped (n⁺) n-type silicon carbide region 864. Note that the source region 864' may only be provided on one side of the gate trench 880 in some embodiments since a channel is only formed on one side of the gate trench 880, FIGS. 9A-9D are schematic cross-sectional diagrams illustrating operations 400G, 500D, 600D, and 700D, respectively, within methods of forming a gate trench power MOSFET according to embodiments of the present inventive concepts. The operation 400G may be used optionally in conjunction with operations 400A-F of FIGS. 4A-F. The operation 500D may be used optionally in conjunction with operations 500A-C of FIGS. 5A-C. The operation 600D may be used optionally in conjunction with operations 600A-C of FIGS. 6A-C, and the operation 700D may be used optionally in conjunction with operations 700A-C of FIGS. 7A-C. In each of operations 400G, 500D, 600D, and 700D, a short trench re-etch may be performed to widen gate trench 480, 580, 680, and 780, respectively, into gate trench 980. This may remove material from the sidewalls of the silicon carbide source layer 160, the sidewalls of the p-type layer 170, and the sidewalls of the lightly-doped n silicon carbide drift region 120 that were inadvertently doped during formation of the deep shielding patterns 440, 540, 640, and 740.

Figure 10:
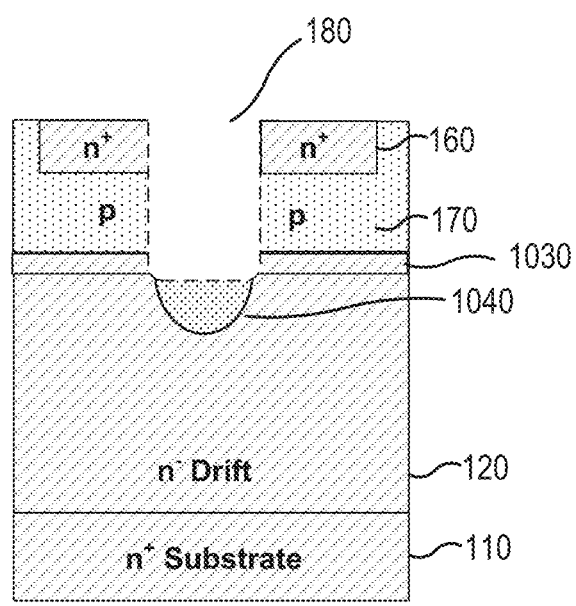
FIG. 10 is a schematic cross-sectional diagram illustrating a current spreading layer present in a gate trench power MOSFET according to embodiments of the present inventive concepts.
Figure 15:
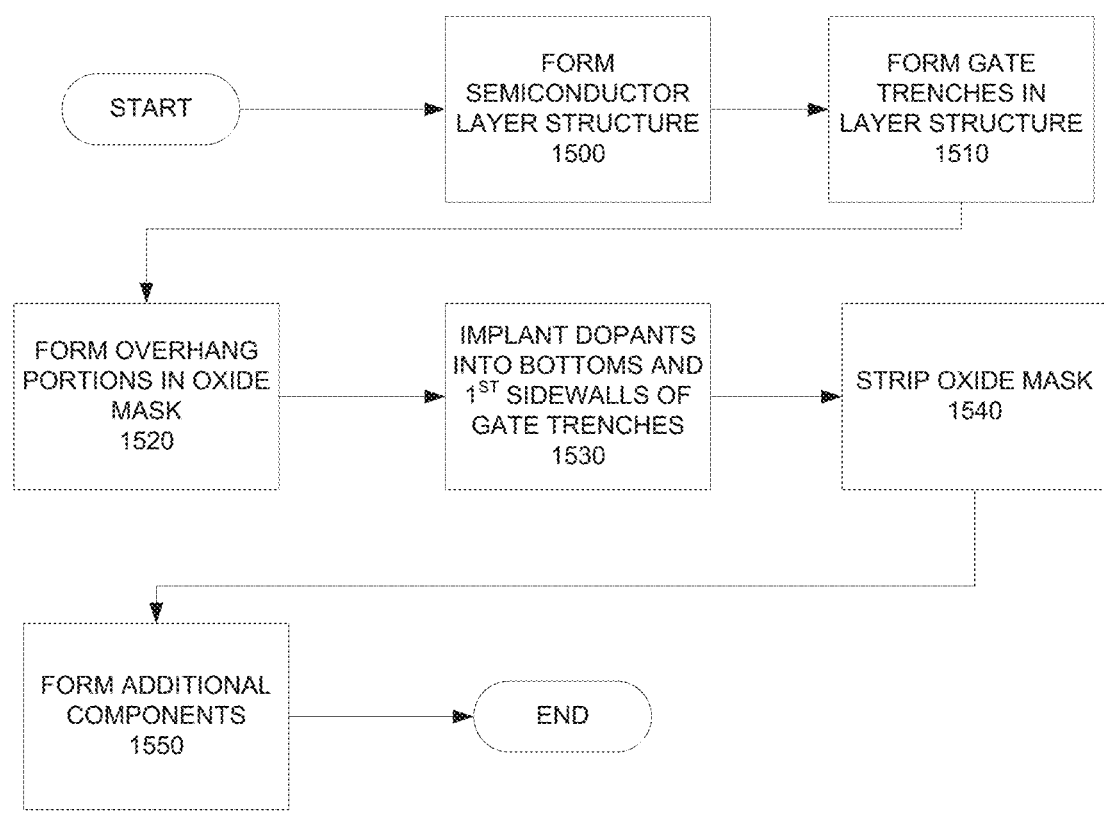
FIGS. 15-20 are flow charts illustrating methods of fabricating gate trench power semiconductor devices according to embodiments of the present inventive concepts.
Figure 16:
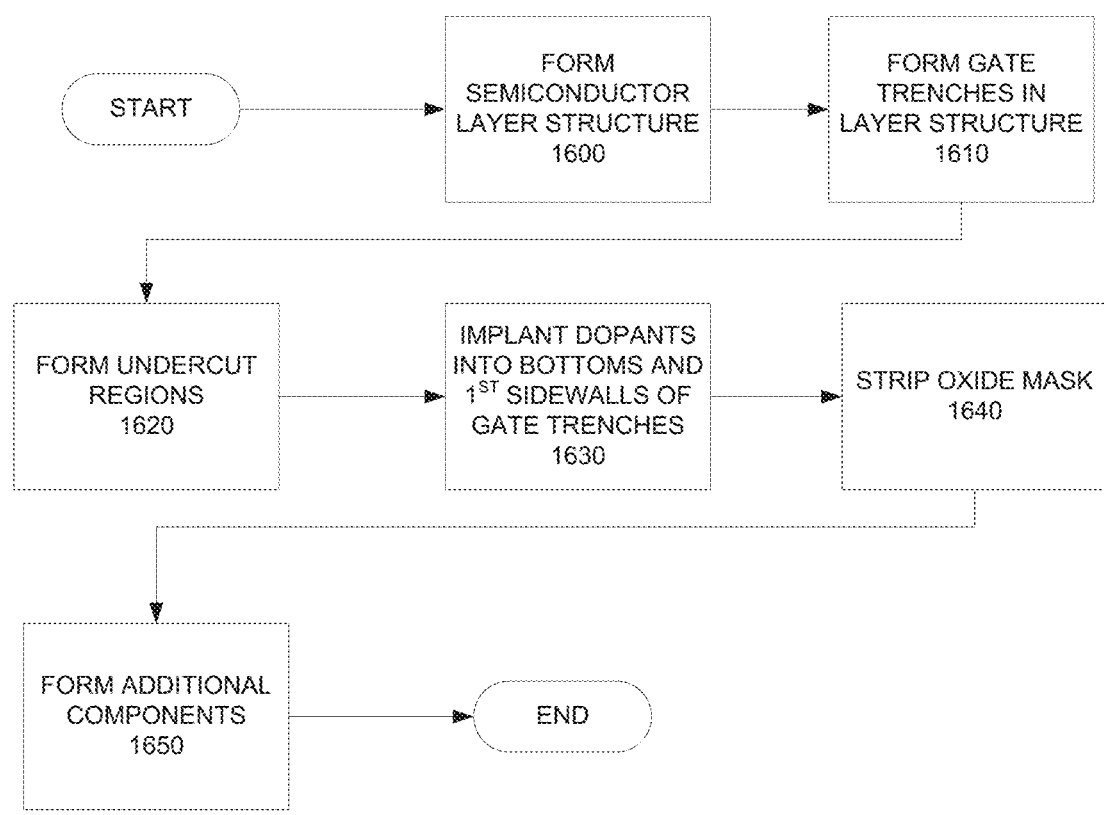
Figure 17:
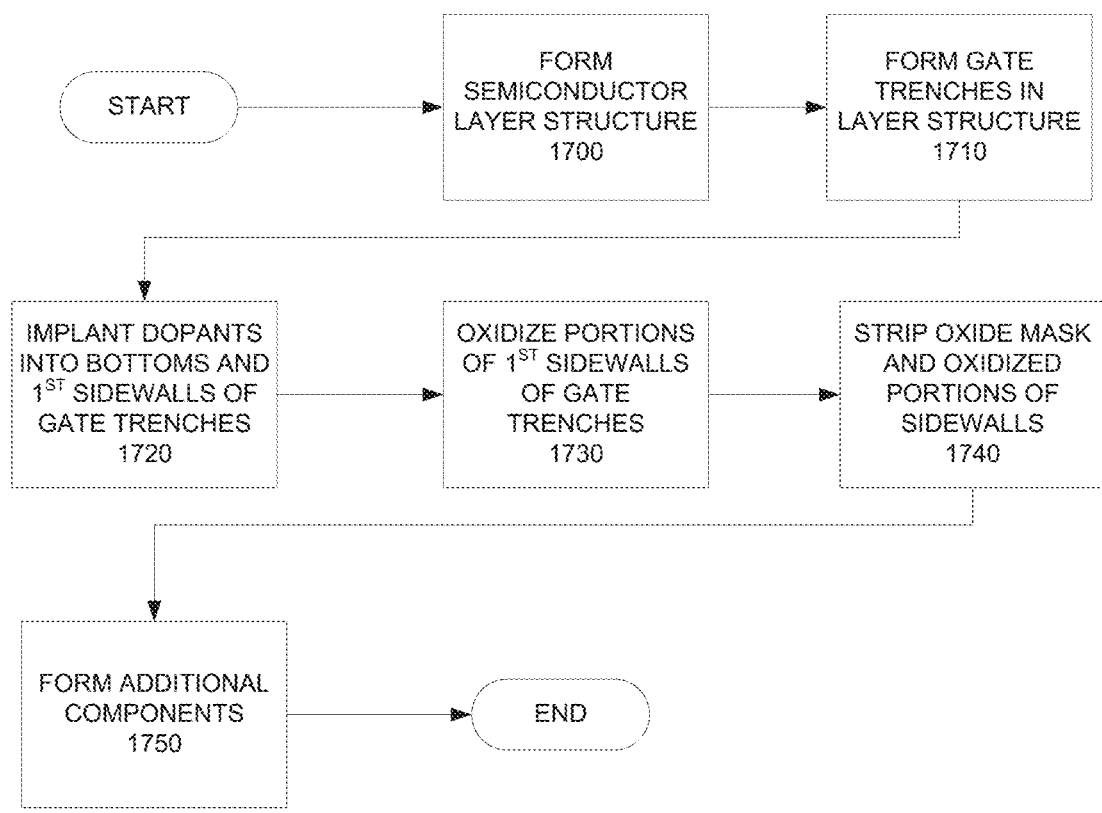
Figure 18:
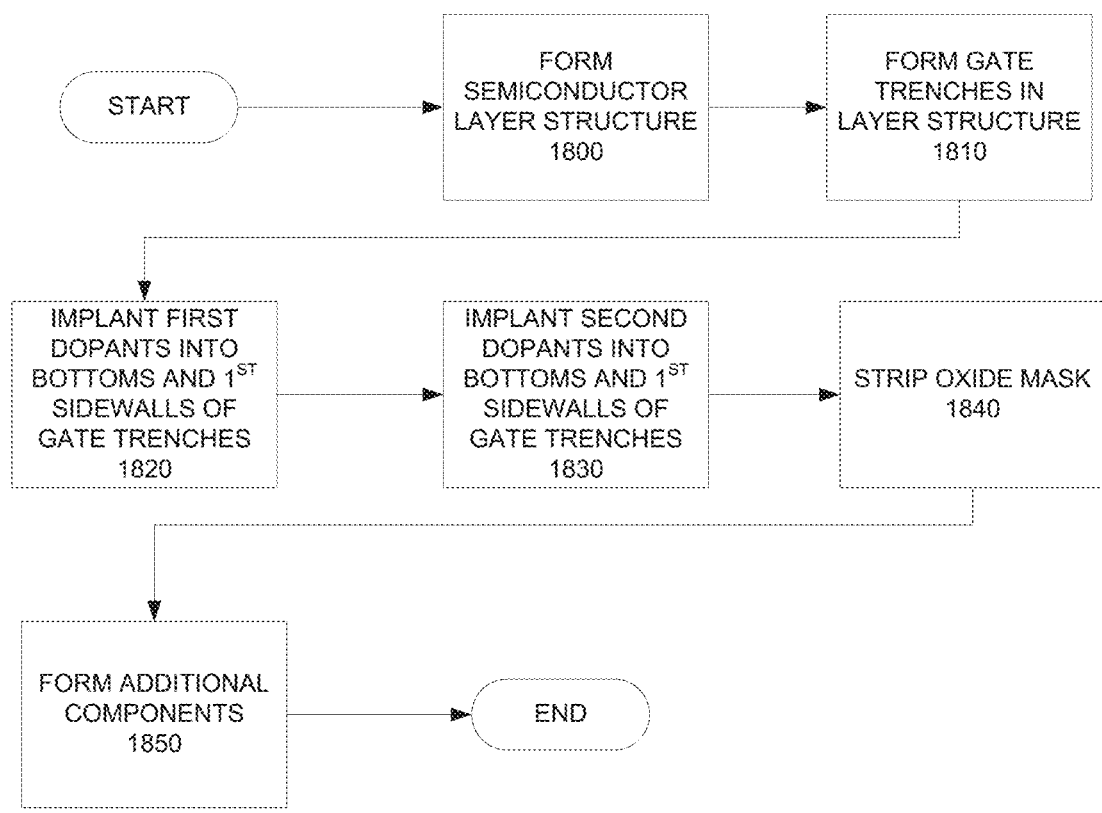
Figure 19:
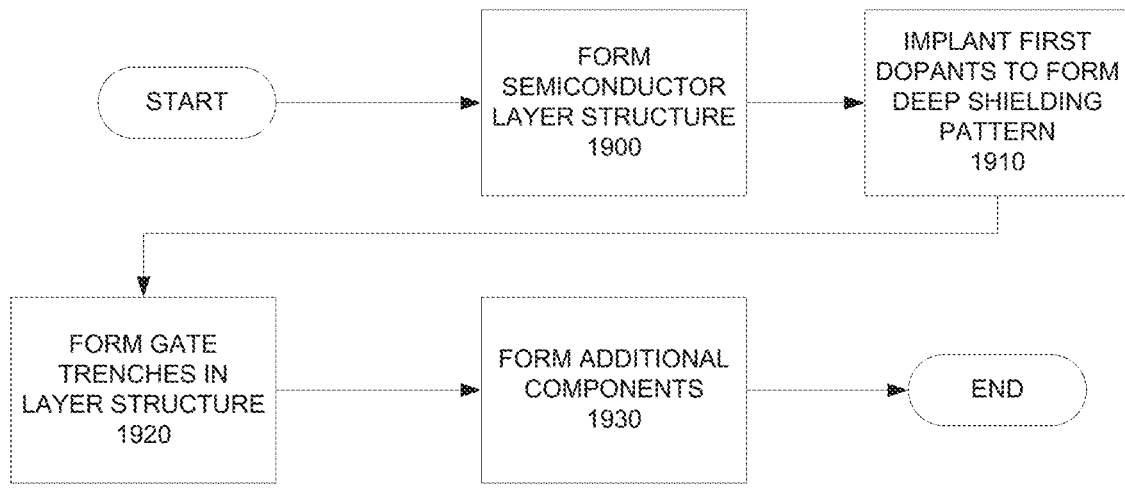
Figure 20:

FIG. 10 is a schematic cross-sectional diagram illustrating that in some embodiments a more highly doped n-type current spreading layer (CSL) 1030 may be present at an upper portion of the drift region 120. In other words, the upper portion of the n-type silicon carbide drift region 120 may be an n-type silicon carbide current spreading layer 1030. The n-type silicon carbide current spreading layer 1030 may be grown in the same processing step as the remainder of the n-type silicon carbide drift region 120 and may be considered to be part of the silicon carbide drift region 120. The n-type silicon carbide current spreading layer 1030 may be a moderately-doped layer that has a doping concentration that exceeds the doping concentration of the remainder of the n-type silicon carbide drift region 1020, which may be more lightly-doped n-silicon carbide. The presence of the current spreading layer 1030 may help to reduce the on-state resistance and may help suppress JFET resistance. The doping and/or thickness of this layer may be designed to avoid punch-through of the channel region and/or high electric field in the oxide during off-state operation.

As seen in FIG. 10, in some embodiments a device may include a wide band-gap semiconductor layer structure on a substrate 110. The semiconductor layer structure may include a drift region 120 that has a first conductivity type and a current spreading layer 1030 that has the first conductivity type located on an upper surface of the drift region 120. One or more gate trenches 180 (e.g., a plurality of gate trenches) may be in an upper portion of the semiconductor layer structure. Each gate trench 180 may have a bottom surface 180B, a first sidewall 180S1, a second sidewall 180S2, and an upper opening 180U. The device may include a plurality of deep shielding patterns 1040, with each deep shielding pattern 1040 having implanted ions of a second conductivity type that is opposite the first conductivity type. Each deep shielding pattern 1040 may be within the semiconductor layer structure and below a respective gate trench 180 of the plurality of gate trenches. A lower surface 1030L of the current spreading layer 1030 may be higher (e.g., may be farther from the substrate 110) than the bottom surfaces 180B of the gate trenches 180.

The current spreading layer 1030 may be included in any of the above-described embodiments. FIGS. 11A-F are schematic cross-sectional diagrams that illustrate operations 1100A-1100F, respectively, which may be present within methods of fabricating a gate trench power MOSFET according to embodiments of the present inventive concepts. FIGS. 11A-F are similar to FIGS. 4A-F, with the difference being the inclusion of the current spreading layer 1130. As such, discussion of the operations 1100A-1100F largely overlaps with discussion of the operations 400A-F, and may be omitted herein in favor of the above in the interest of brevity. Similarly, FIGS. 12A-C are schematic cross-sectional diagrams that illustrate operations 1200A-1200C, respectively, which may be present within methods of fabricating a gate trench power MOSFET according to embodiments of the present inventive concepts. FIGS. 12A-C are similar to FIGS. 5A-C, with the difference being the inclusion of the current spreading layer 1230. As such, discussion of the operations 1200A-1200C largely overlaps with discussion of the operations 500A-C, and may be omitted herein in favor of the above in the interest of brevity. FIGS. 13A-C are schematic cross-sectional diagrams that illustrate operations 1300A-1300C, respectively, which may be present within methods of fabricating a gate trench power MOSFET according to embodiments of the present inventive concepts. FIGS. 13A-C are similar to FIGS. 6A-C, with the difference being the inclusion of the current spreading layer 1330. As such, discussion of the operations 1300A-1300C largely overlaps with discussion of the operations 600A-C, and may be omitted herein in favor of the above in the interest of brevity. FIGS. 14A-C are schematic cross-sectional diagrams that illustrate operations 1400A-1400C, respectively, which may be present within methods of fabricating a gate trench power MOSFET according to embodiments of the present inventive concepts. FIGS. 14A-C are similar to FIGS. 7A-C, with the difference being the inclusion of the current spreading layer 1430. As such, discussion of the operations 1400A-1400C largely overlaps with discussion of the operations 700A-C, and may be omitted herein in favor of the above in the interest of brevity.

FIGS. 15-20 are flow charts that illustrate methods of fabricating a gate trench power semiconductor device according to embodiments of the present inventive concepts.

With reference to FIG. 15 and FIGS. 4A-4F, operations may begin with formation of a wide band-gap semiconductor layer structure (Block 1500). The semiconductor layer structure may include a substrate and a plurality of semiconductor layers that are grown on the substrate by epitaxial growth and/or formed by ion implantation. The semiconductor layer structure may include a drift region that has a first conductivity type. The semiconductor layer structure may further include well regions having a second conductivity type on the drift region and source regions having the first conductivity type in upper portions of the well regions. In some embodiments, the semiconductor layer structure may include a current spreading layer that has the first conductivity type. A plurality of gate trenches are formed in an upper surface of the semiconductor layer structure (Block 1510). The gate trenches may extend in a first direction and may be spaced apart from each other in a second direction that is perpendicular to the first direction. Each gate trench may have a bottom surface, a first sidewall that extends in the first direction and a second sidewall that extends in the first direction. Overhang portions may be formed over the gate trench (Block 1520). In some embodiments, the overhang portion may comprise a polysilicon layer and an oxide layer that have been deposited on an upper surface of the semiconductor layer structure and then oxidized, resulting in a volume expansion that partially obscures a bottom surface of the gate trenches. Dopants having the second conductivity type that is opposite the first conductivity type may be implanted into the bottom surfaces of the respective gate trenches (Block 1530). The second conductivity dopants implanted into the bottom surfaces of the gate trenches may form a plurality of deep shielding patterns underneath the respective gate trenches. The oxide mask (e.g., the polysilicon layer and the oxide layer) may be stripped (Block 1540). Additional components, such as gate insulating layers, gate electrodes, and contacts may be formed on the top and bottom surfaces of the semiconductor layer structure to complete the device (Block 1550).

With reference to FIG. 16 and FIGS. 5A-5C, operations may begin with the formation of a wide band-gap semiconductor layer structure (Block 1600). The semiconductor layer structure may include a substrate and a plurality of semiconductor layers that are grown on the substrate by epitaxial growth and/or formed by ion implantation. The semiconductor layer structure may include a drift region that has a first conductivity type. The semiconductor layer structure may further include well regions having a second conductivity type on the drift region and source regions having the first conductivity type in upper portions of the well regions. In some embodiments, the semiconductor layer structure may include a current spreading layer that has the first conductivity type. A plurality of gate trenches are formed in an upper surface of the semiconductor layer structure (Block 1610). The gate trenches may extend in a first direction and may be spaced apart from each other in a second direction that is perpendicular to the first direction. Each gate trench may have a bottom surface, a first sidewall that extends in the first direction and a second sidewall that extends in the first direction. Undercut regions may be formed within the gate trench (Block 1620). In some embodiments, the undercut regions may be formed by performing an isotropic etch, resulting in undercut regions beneath an oxide mask formed on an upper surface of the semiconductor layer structure. Dopants having the second conductivity type that is opposite the first conductivity type may be implanted into the bottom surfaces of the respective gate trenches (Block 1630). The second conductivity dopants implanted into the bottom surfaces of the gate trenches may form a plurality of deep shielding patterns underneath the respective gate trenches. The oxide mask may be stripped (Block 1640). Additional components, such as gate insulating layers, gate electrodes, and contacts may be formed on the top and bottom surfaces of the semiconductor layer structure to complete the device (Block 1650).

With reference to FIG. 17 and FIGS. 6A-6C, operations may begin with formation of a wide band-gap semiconductor layer structure (Block 1700). The semiconductor layer structure may include a substrate and a plurality of semiconductor layers that are grown on the substrate by epitaxial growth and/or formed by ion implantation. The semiconductor layer structure may include a drift region that has a first conductivity type. The semiconductor layer structure may further include well regions having a second conductivity type on the drift region and source regions having the first conductivity type in upper portions of the well regions. In some embodiments, the semiconductor layer structure may include a current spreading layer that has the first conductivity type. A plurality of gate trenches are formed in an upper surface of the semiconductor layer structure (Block 1710). The gate trenches may extend in a first direction and may be spaced apart from each other in a second direction that is perpendicular to the first direction. Dopants having the second conductivity type that is opposite the first conductivity type may be implanted into the sidewalls and the bottom surfaces of the respective gate trenches (Block 1720). The second conductivity dopants implanted into the bottom surfaces of the gate trenches may form a plurality of deep shielding patterns underneath the respective gate trenches. Portions of the sidewalls of at least some of the semiconductor layers that are exposed by the gate trench may be oxidized (Block 1730). The oxide mask and the oxidized portions of the sidewalls of at least some of the semiconductor layers may be stripped (Block 1740). Additional components, such as gate insulating layers, gate electrodes, and contacts may be formed on the top and bottom surfaces of the semiconductor layer structure to complete the device (Block 1750).

With reference to FIG. 18 and FIGS. 7A-7C, operations may begin with formation of a wide band-gap semiconductor layer structure (Block 1800). The semiconductor layer structure may include a substrate and a plurality of semiconductor layers that are grown on the substrate by epitaxial growth and/or formed by ion implantation. The semiconductor layer structure may include a drift region that has a first conductivity type. The semiconductor layer structure may further include well regions having a second conductivity type on the drift region and source regions having the first conductivity type in upper portions of the well regions. In some embodiments, the semiconductor layer structure may include a current spreading layer that has the first conductivity type. A plurality of gate trenches are formed in an upper surface of the semiconductor layer structure (Block 1810). The gate trenches may extend in a first direction and may be spaced apart from each other in a second direction that is perpendicular to the first direction. Each gate trench may have a bottom surface, a first sidewall that extends in the first direction and a second sidewall that extends in the first direction. Dopants having the second conductivity type that is opposite the first conductivity type are implanted into the sidewalls and bottom surfaces of the respective gate trenches (Block 1820). The second conductivity dopants implanted into the bottom surfaces of the gate trenches may form a plurality of deep shielding patterns underneath the respective gate trenches. Dopants having the first conductivity type may be implanted into the sidewalls (Block 1830). The first conductivity dopants implanted into the sidewalls of the gate trenches may be implanted into the first sidewalls of the gate trenches using an angled ion implant. The angled ion implant may be at an implant angle of, for example, between 5 and 45 degrees in some embodiments. Any oxide mask present on an upper surface of the semiconductor layer structure is stripped (Block 1840). Additional components, such as gate insulating layers, gate electrodes, and contacts may be formed on the top and bottom surfaces of the semiconductor layer structure to complete the device (Block 1850).

With reference to FIG. 19 and FIGS. 8A-8F, operations may begin with formation of a wide band-gap semiconductor layer structure (Block 1900). The semiconductor layer structure may include a substrate and a plurality of semiconductor layers that are grown on the substrate by epitaxial growth and/or formed by ion implantation. The semiconductor layer structure may include a drift region that has a first conductivity type. The semiconductor layer structure may further include well regions having a second conductivity type on the drift region and source regions having the first conductivity type in upper portions of the well regions. In some embodiments, the semiconductor layer structure may include a current spreading layer that has the first conductivity type. Dopants having the second conductivity type that is opposite the first conductivity type may be implanted into the semiconductor layer structure (Block 1910). The second conductivity dopants implanted may form a plurality of deep shielding patterns. A plurality of gate trenches are formed in an upper surface of the semiconductor layer structure (Block 1920). The gate trenches may extend in a first direction and may be spaced apart from each other in a second direction that is perpendicular to the first direction. Each gate trench may have a bottom surface, a first sidewall that extends in the first direction and a second sidewall that extends in the first direction. Additional components, such as gate insulating layers, gate electrodes, and contacts may be formed on the top and bottom surfaces of the semiconductor layer structure to complete the device (Block 1930).

With reference to FIG. 20, FIGS. 9A-9D, and FIGS. 15-18, in some embodiments, methods described above with reference to the flow charts of FIGS. 15-18 may include an additional short re-etching to remove inadvertently implanted ions from the sidewalls of the layers of the semiconductor layer structure exposed by the gate trenches (Block 1945). The short re-etching operation of FIG. 20 may also be used with semiconductor layer structures that include the current spreading layers described with reference to FIGS. 11-14.

In the description above, each example embodiment has a certain conductivity type. It will be appreciated that opposite conductivity type devices may be formed by simply reversing the conductivity of the n-type and p-type layers in each of the above embodiments. Thus, it will be appreciated that the present invention covers both n-channel and p-channel devices for each different device structure (e.g., MOS- FET, IGBT, etc.). Herein, where a contact can be either a source contact or a drain contact it may be referred to as a "source/drain contact."

While the present invention is described above with respect to power MOSFET and power IGBT implementations, it will be appreciated that the techniques described herein apply equally well to other similar vertical power devices having a gate trench. Thus, embodiments of the present invention are not limited MOSFETs and IGBTs, and the techniques disclosed herein may be used on any appropriate gate trench device.

The present invention has primarily been discussed above with respect to silicon carbide based power semiconductor devices. It will be appreciated, however, that silicon carbide is used herein as an example and that the devices discussed herein may be formed in any appropriate wide band-gap semiconductor material system. As an example, gallium nitride based semiconductor materials (e.g., gallium nitride, aluminum gallium nitride, etc.) may be used instead of silicon carbide in any of the embodiments described above.

It will also be appreciated that the different features of the different embodiments described herein may be combined to provide additional embodiments. For example, it was discussed above with respect to one embodiment that junction termination extensions could be used in place of guard rings. This is true in each embodiment disclosed herein. Likewise, the shield regions under the gate trenches may be included or omitted in any of the embodiments. Any of the embodiments may also include well regions that have varying dopant concentrations including lower doped channel regions.

Embodiments of the present invention have been described above with reference to the accompanying drawings, in which embodiments of the invention are shown. It will be appreciated, however, that this invention may, however, be embodied in many different forms and should not be construed as limited to the embodiments set forth above. Rather, these embodiments are provided so that this disclosure will be thorough and complete, and will fully convey the scope of the invention to those skilled in the art. Like numbers refer to like elements throughout.

It will be understood that, although the terms first, second, etc. are used throughout this specification to describe various elements, these elements should not be limited by these terms. These terms are only used to distinguish one element from another. For example, a first element could be termed a second element, and, similarly, a second element could be termed a first element, without departing from the scope of the present invention. The term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "top" or "bottom" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Embodiments of the invention are also described with reference to a flow chart. It will be appreciated that the steps shown in the flow chart need not be performed in the order shown.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A method of forming a semiconductor device, the method comprising:

forming a wide band-gap semiconductor layer structure on a substrate, the semiconductor layer structure including a drift region that has a first conductivity type and well regions having a second conductivity type that is opposite the first conductivity type;

forming a plurality of gate trenches in an upper portion of the semiconductor layer structure, the gate trenches spaced apart from each other, each gate trench having a bottom surface and an upper opening, and each gate trench exposing sidewalls of the drift region;

after forming the plurality of gate trenches, and prior to implanting any shielding dopants that will form deep shielding patterns at the bottoms of the gate trenches, forming an obstruction over a portion of each gate trench that partially obscures the upper opening; and after forming the obstruction, implanting the shielding dopants into the bottom surfaces of the gate trenches, the shielding dopants having the second conductivity type, wherein the shielding dopants implanted into the bottom surface of the gate trenches form the deep shielding patterns, and wherein the sidewalls of the drift region remain exposed by the gate trenches during the implanting of the shielding dopants.

2. The method of claim 1, wherein the semiconductor layer structure includes a current spreading layer that has the first conductivity type located on an upper surface of the drift region.

3. The method of claim 1, wherein channel regions are formed in respective first and second sidewalls of the gate trenches.

4. The method of claim 3, wherein the channel regions are formed in the well regions.

5. The method of claim 4, wherein the semiconductor layer structure is formed in a single epitaxial growth process.

6. The method of claim 1, further comprising forming a first source/drain contact on a first major surface of the semiconductor layer structure and forming a second source/drain contact on a second major surface of the semiconductor layer structure opposite the first surface.

7. The method of claim 1, further comprising forming gate structures within the respective gate trenches, wherein the gate structures each comprises a gate oxide.

8. The method of claim 1, wherein the wide band-gap semiconductor comprises silicon carbide.

9. A method of forming a semiconductor device, the method comprising:
   forming a wide band-gap semiconductor layer structure on a substrate, the semiconductor layer structure including a drift region that has a first conductivity type;
   forming a plurality of gate trenches in an upper portion of the semiconductor layer structure, the gate trenches spaced apart from each other, each gate trench having a bottom surface, a first sidewall, a second sidewall, and an upper opening;
   after forming the plurality of gate trenches, depositing a first material layer and an oxide layer on an upper surface of the semiconductor layer structure and oxidizing the first material layer, thereby forming an obstruction over a portion of each gate trench that partially obscures the upper opening; and
   after forming the obstruction, implanting dopants having a second conductivity type that is opposite the first conductivity type into the bottom surfaces of the gate trenches, wherein the dopants implanted into the bottom surface of the gate trenches form deep shielding patterns.

10. The method of claim 9, wherein the first material layer comprises a polysilicon layer.

11. A method of forming a semiconductor device, the method comprising:
   forming a wide band-gap semiconductor layer structure on a substrate, the semiconductor layer structure including a drift region that has a first conductivity type and well regions having a second conductivity type that is opposite the first conductivity type;
   forming a plurality of gate trenches in an upper portion of the semiconductor layer structure, the gate trenches spaced apart from each other, each gate trench having a bottom surface, a first sidewall, a second sidewall, and an upper opening;
   after forming the plurality of gate trenches, and prior to implanting any shielding dopants that will form deep shielding patterns at the bottoms of the gate trenches, forming a mask oxide layer on an upper surface of the semiconductor layer structure and performing isotropic etching of portions of the semiconductor layer structure underneath the mask oxide layer, resulting in undercut portions of the semiconductor layer structure, thereby forming an obstruction over a portion of each gate trench that partially obscures the upper opening; and
   after forming the obstruction, implanting the shielding dopants into the bottom surfaces of the gate trenches, the shielding dopants having the second conductivity type, wherein the shielding dopants implanted into the bottom surface of the gate trenches form the deep shielding patterns.

12. A method of forming a semiconductor device, the method comprising:
   forming a wide band-gap semiconductor layer structure on a substrate, the semiconductor layer structure including a drift region that has a first conductivity type and well regions having a second conductivity type that is opposite the first conductivity type;
   forming a plurality of gate trenches in an upper portion of the semiconductor layer structure, the gate trenches spaced apart from each other, each gate trench having a bottom surface, a first sidewall, a second sidewall, and an upper opening, and each gate trench exposing sidewalls of the drift region and the well regions;
   after forming the plurality of gate trenches, and prior to implanting any shielding dopants that will form deep shielding patterns at the bottoms of the gate trenches, forming an overhang over a portion of each gate trench configured to inhibit implantation of the shielding dopants into the first and second sidewalls of each gate trench; and
   after forming the overhang, implanting the shielding dopants into the bottom surfaces of the gate trenches, wherein the shielding dopants implanted into the bottom surface of the gate trenches form the deep shielding patterns and have the second conductivity type, and wherein the sidewalls of the drift region and the well regions remain exposed by the gate trenches during the implanting of the shielding dopants.

13. The method of claim 12, wherein the semiconductor layer structure includes a current spreading layer that has the first conductivity type located on an upper surface of the drift region.

14. The method of claim 12, wherein channel regions are formed in the respective first and second sidewalls of the gate trenches.

15. The method of claim 14, wherein the channel regions are formed in the well regions.

16. A method of forming a semiconductor device, the method comprising:
   forming a wide band-gap semiconductor layer structure on a substrate, the semiconductor layer structure including a drift region that has a first conductivity type;
   forming a plurality of gate trenches in an upper portion of the semiconductor layer structure, the gate trenches spaced apart from each other, each gate trench having a bottom surface, a first sidewall, a second sidewall, and an upper opening; after forming the plurality of gate trenches and prior to implanting dopants into the gate trenches, forming an overhang over a portion of each gate trench configured to inhibit implantation of dopants into the first and second sidewalls of each gate trench; and after forming the overhang, implanting dopants having a second conductivity type that is opposite the first conductivity type into the bottom surfaces of the gate trenches, wherein the dopants implanted into the bottom surface of the gate trenches form deep shielding patterns, wherein forming the overhang comprises:

depositing a first material layer and an oxide layer on an upper surface of the semiconductor layer structure; and oxidizing the first material layer.

17. The method of claim 16, wherein the first material layer comprises a polysilicon layer.

18. A method of forming a semiconductor device, the method comprising:

forming a wide band-gap semiconductor layer structure on a substrate, the semiconductor layer structure including a drift region that has a first conductivity type and well regions having a second conductivity type that is opposite the first conductivity type;

forming a plurality of gate trenches in an upper portion of the semiconductor layer structure, the gate trenches spaced apart from each other, each gate trench having a bottom surface, a first sidewall, a second sidewall, and an upper opening;

after forming the plurality of gate trenches, and prior to implanting any shielding dopants that will form deep shielding patterns at the bottoms of the gate trenches, forming a mask oxide layer on an upper surface of the semiconductor layer structure and performing isotropic etching of portions of the semiconductor layer structure underneath the mask oxide layer, resulting in undercut portions of the semiconductor layer structure, thereby forming an overhang over a portion of each gate trench configured to inhibit implantation of the shielding dopants into the first and second sidewalls of each gate trench; and after forming the overhang, implanting the shielding dopants into the bottom surfaces of the gate trenches, wherein the shielding dopants implanted into the bottom surface of the gate trenches form the deep shielding patterns and have the second conductivity type.

19. A method of forming a semiconductor device, the method comprising:

forming a wide band-gap semiconductor layer structure on a substrate, the semiconductor layer structure including a drift region that has a first conductivity type and well regions having a second conductivity type that differs from the first conductivity type, the well regions having a first concentration;

forming a plurality of gate trenches in an upper portion of the semiconductor layer structure, the gate trenches spaced apart from each other, each gate trench having a bottom surface and an upper opening, the upper opening having a first width, and each gate trench exposing sidewalls of the drift region and the well regions;

after forming the plurality of gate trenches, and prior to implanting any shielding dopants that will form deep shielding patterns at the bottoms of the gate trenches, forming an obstructing mask over a portion of each gate trench, the obstructing mask having an opening having a second width that is less than the first width; and after forming the obstructing mask, implanting the shielding dopants into the bottom surfaces of the gate trenches, wherein the shielding dopants implanted into the bottom surface of the gate trenches form deep shielding patterns and have the second conductivity type, and wherein the sidewalls of the drift region and the well regions remain exposed by the gate trenches during the implanting of the shielding dopants.

* * * * *

UNITED STATES PATENT AND TRADEMARK OFFICE
CERTIFICATE OF CORRECTION

| | |
|---|---|
| PATENT NO. | : 12,094,926 B2 |
| APPLICATION NO. | : 16/993680 |
| DATED | : September 17, 2024 |
| INVENTOR(S) | : Lichtenwalner et al. |

It is certified that error appears in the above-identified patent and that said Letters Patent is hereby corrected as shown below:

On the Title Page

Item (71) Applicant: Please correct "Cree, Inc." to read --Wolfspeed, Inc.--

In the Specification

Column 13, Line 7: Please correct "lightly-doped n" to read --lightly-doped $n^-$--

Column 14, Line 2: Please correct "lightly-doped n" to read --lightly-doped $n^-$--

Column 14, Line 58: Please correct "doped n" to read --doped $n^-$--

Column 15, Line 10: Please correct "lightly-doped n" to read --lightly-doped $n^-$--

Column 16, Lines 30-38: Please correct "Stated differently in some embodiments the heavily-doped (p+) silicon carbide deep shielding pattern 840. In particular, as shown in FIG. 8D, the heavily-doped(p+) silicon carbide deep shielding pattern 840 may extend farther to the left than the heavily-doped(n+) n-type silicon carbide region 864. Note that the source region 864' may only be provided on one side of the gate trench 880 in some embodiments since a channel is only formed on one side of the gate trench 880," to read --Stated differently, in some embodiments, the heavily-doped ($n^+$) n-type silicon carbide region 864 may be formed asymmetrically with respect to the heavily-doped ($p^+$) silicon carbide deep shielding pattern 840. In particular, as shown in FIG. 8D, the heavily-doped ($p^+$) silicon carbide deep shielding pattern 840 may extend farther to the left than the heavily-doped ($n^+$) n-type silicon carbide region 864. Note that the source region 864' may only be provided on one side of the gate trench 880 in some embodiments since a channel is only formed on one side of the gate trench 880.--

Column 16, Line 55: Please correct "lightly-doped n" to read --lightly-doped $n^-$--

Signed and Sealed this
Tenth Day of December, 2024

Katherine Kelly Vidal
*Director of the United States Patent and Trademark Office*